United States Patent [19]
Das

[11] Patent Number: 5,589,440
[45] Date of Patent: *Dec. 31, 1996

[54] FERROELECTRIC RF LIMITER

[76] Inventor: Satyendranath Das, P.O. Box 574, Mountain View, Calif. 94042-0574

[ * ] Notice: The term of this patent shall not extend beyond the expiration date of Pat. No. 5,329,261.

[21] Appl. No.: 207,750

[22] Filed: Mar. 9, 1994

Related U.S. Application Data

[63] Continuation-in-part of Ser. No. 70,738, May 27, 1993, Pat. No. 5,329,261.
[51] Int. Cl.$^6$ .............................. H01P 1/22; H01B 12/06
[52] U.S. Cl. ...................... 505/210; 333/17.2; 333/99 S; 505/700; 505/866
[58] Field of Search ................................ 333/17.2, 81 A, 333/81 B, 99 S; 505/700, 701, 703, 866

[56] References Cited

U.S. PATENT DOCUMENTS

| | | | |
|---|---|---|---|
| 3,309,626 | 3/1967 | Higgins | 333/17.2 X |
| 5,329,261 | 7/1994 | Das | 333/17.2 |

OTHER PUBLICATIONS

Cohn et al., A High–Power Limiter, IEEE Trans. on MTT, Jan. 1965, pp. 47–54.
Horton et al., A One–Ghz Ferroelectric Limiter, IEEE Trans. on MTT, Sep. 1967, pp. 517–523.

Primary Examiner—Paul Gensler

[57] ABSTRACT

High Tc superconducting limiters are designed to operate at two or more levels of input signals. In one waveguide embodiment, multiple half wavelength branch waveguide lines are connected to a main waveguide line. The half wavelength lines are terminated with tuned circuits of a capacitance, made of a ferroelectric material, and an inductance provided by a waveguide line. In another waveguide embodiment, the branch lines are terminated in tuned cavities each having a ferroelectric material. In a microstrip embodiment, multiple half wavelength branch ferroelectric lines of different impedances are connected to a main line. In a second microstrip line embodiment, tuned circuits, with differing L and C values, are connected to a main transmission line through a half a wavelength branch transmission line. The capacitance is made of a ferroelectric material. The conductor, deposited on the microstrip lines, and the waveguides are made of a single crystal high Tc superconductor.

20 Claims, 16 Drawing Sheets

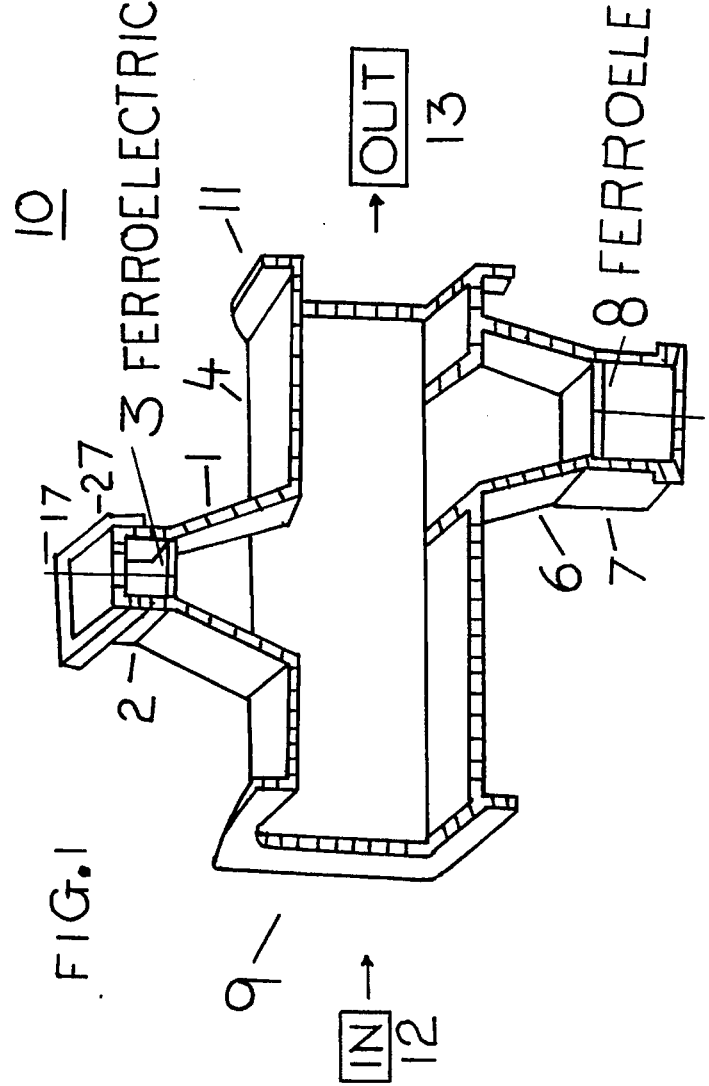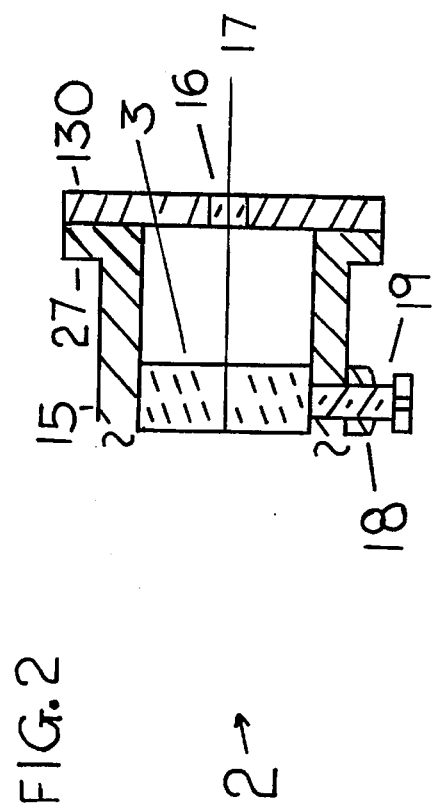

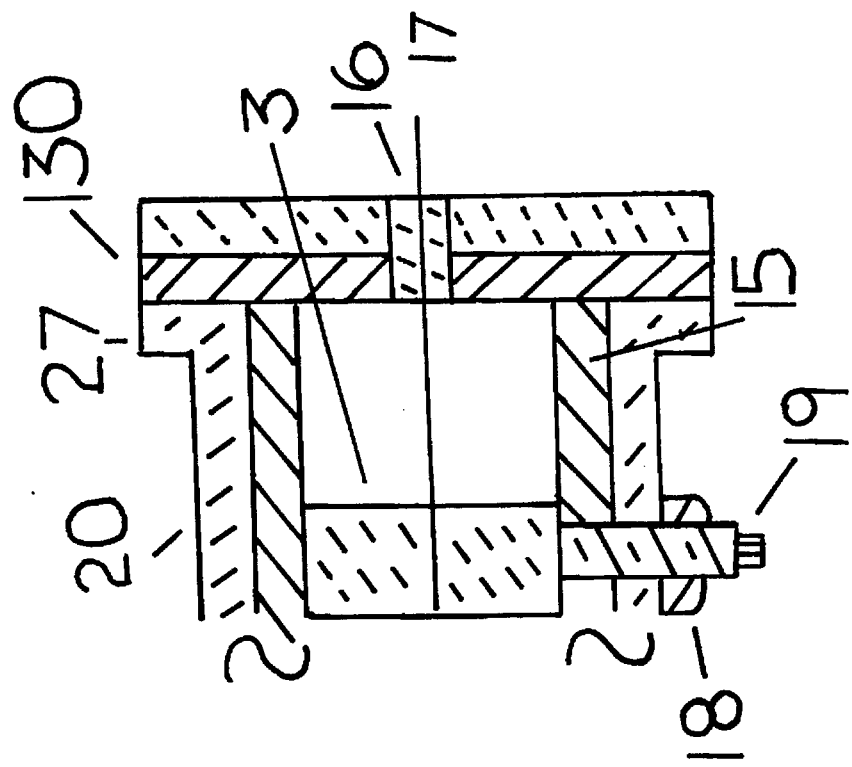

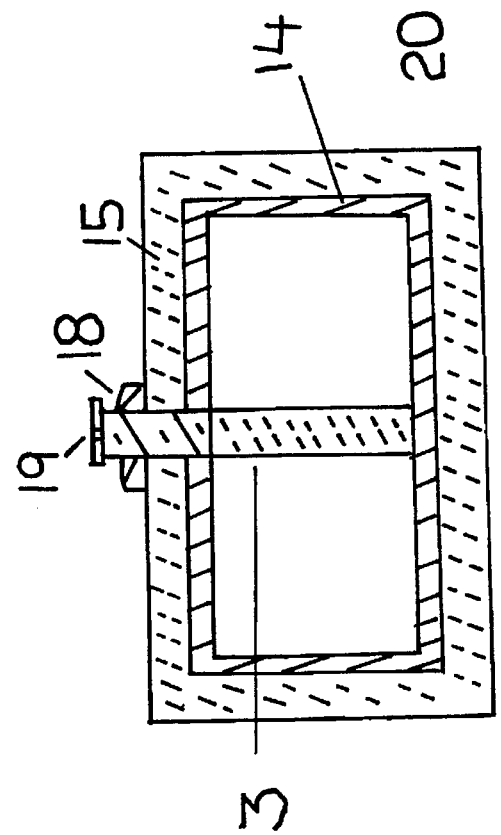
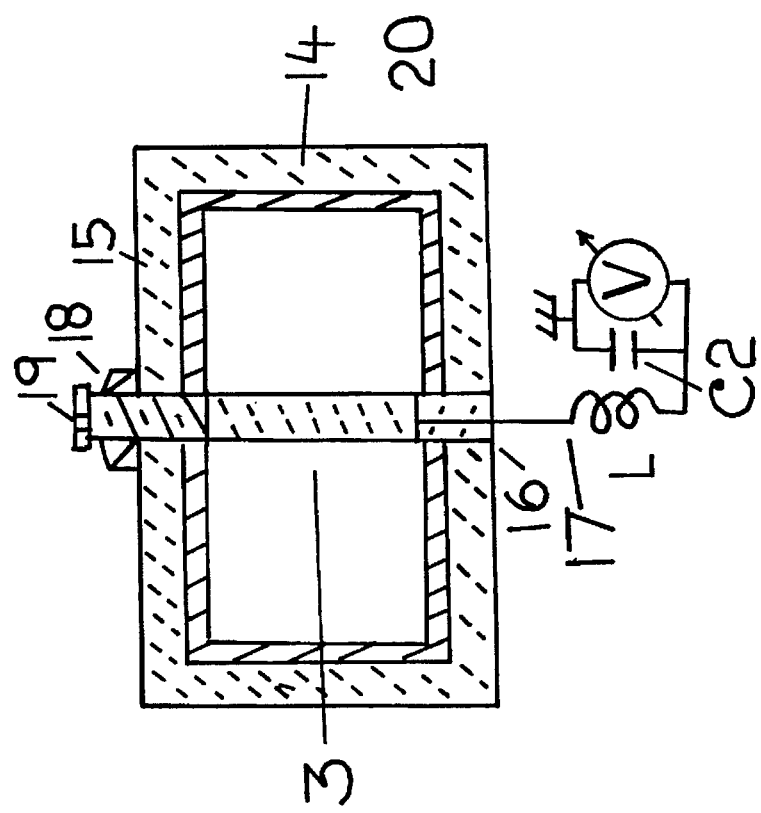

FERROELECTRIC RF LIMITER

This application is a continuation-in-part of application Ser. No. 80/070,738, filed May 27, 1993, now U.S. Pat. No. 5,329,261.

Field of Invention

The present invention relates to limiters of electromagnetic waves and more particularly to RF limiters.

In many fields of electronics, it is often necessary to limit the output signal level. Commercial semiconductor, ferrite type and tube type limiters are available.

Ferroelectric materials have a number of attractive properties. Ferroelectrics can handle high peak power. The average power handling capacity is governed by the dielectric loss of the material. They have low switching time (such as 100 nS). Some ferroelectrics have low losses. The permittivity of ferroelectrics is generally large, as such the device is small in size. The ferroelectrics are operated in the paraelectric phase i.e. slightly above the Curie temperature. The ferroelectric limiter can be made of thin films, and can be integrated with other monolithic microwave/RF devices. Inherently, they have a broad bandwidth. They have no low frequency limitation as in the case of ferrite devices. The high frequency operation is governed by the relaxation frequency, such as 95 GHz for strontium titanate, of the ferroelectric material. The loss of the ferroelectric RF limiter is low with ferroelectric materials with a low loss tangent. A number of ferroelectric materials are not subject to burnout. Ferroelectric limiters are reciprocal devices.

In Ser. No. 08/291,702, the following statement is made: "Das discussed operation, of microwave ferroelectric devices, slightly above the Curie temperature, to avoid hysteresis and showed the permittivity of a ferroelectric material to be maximum at the Curie temperature and the permittivity to reduce in magnitude as one moves away from the Curie temperature. S. Das, "Quality of a Ferroelectric Material," IEEE Trans. MTT-12, pp. 440–445, Jul. 1964 and In Ser. No. 08/291,702 the following statement is made: "Another object of this design is to design filters to handle power levels of at least 0.5 Megawatt. G. Shen, C. Wilker, P. Pang and W. L. Holstein, "High Tc Superconducting-sapphire Microwave resonator with Extremely High Q-Values Up To 90K," IEEE MTT-S Digest, pp. 193–196, 1992.

Cavity type ferroelectric limiters, built by M. Cohn and A. F. Eikenberg, "A High-Power Limiter," IEEE Trans, MTT-13, pp. 47–54, January 1965, are capable of handling peak input power levels in excess of 25 kW with a small signal insertion loss of 0.5 dB. The ferroelectric limiter, developed by J. B. Horton and M. Donaldson, "One-GHz Ferroelectric Limiter," IEEE Trans., MTT-15, No.9, pp. 517–523, September 1967, uses a ferroelectric capacitor to resonate with an inductor across a quarter-wave branch line connected to the main line. Edge coupled quadrature filters have been discussed by B. J. Minnis, "Printed Circuit Coupled-line Filters for Bandwidths Up to and greater than an octave", IEEE Microw. Theo. & Tech., vol. MTT-29, pp. 215–222, March 1981. This type of filter can be used for isolating the d.c. connected to the limiter from the rest of the microwave circuits.

Depending on trade-off studies in individual cases, the best type of limiter can be selected.

SUMMARY OF THE INVENTION

The general purpose of this invention is to provide a low loss limiter which embraces the advantages of similarly employed conventional devices such as semiconductor, ferrite and tube devices.

To attain this, the present invention contemplates the use of a main transmission line containing a low loss dielectric material. The output impedance is controlled by a branch line connected to the main line. The branch line contains a ferroelectric material, d.c. biased to a lower permittivity, whose permittivity is controlled by the level of input signal. At low signal levels, the branch line impinges a very high impedance on the output circuit of the main line. At higher signal levels, the permittivity of the ferroelectric material is increased impinging a lower impedance on the output circuit of the main line. This reduces the level of the output signal below the level of the input signal.

It is an object of this invention to provide a limiter which is capable of handling high peak and average power levels. Another object of this invention is to provide a limiter which can be integrated into the structure of microwave and millimeter wave monolithic integrated circuits (MMIC).

Another objective is to design a limiter operating over a large level of input signal. Another objective is to design both waveguide and microstrip line limiters. Another objective is to build reciprocal limiters.

These and other objectives are achieved in accordance with the present invention which comprises of a main RF transmission line two or more half-wavelengths long. A branch or stub line is connected one or more half-wavelengths from the output end.

In one embodiment, the branch line, one or more half wavelengths long, is formed from a ferroelectric material, d.c. biased to a lower value of permittivity, whose permittivity is a function of the input signal level. At a low level of signal, the branch line impinges a very high impedance on the output end of the main transmission line. The input signal travels to the output with a low insertion loss. As the level of the input signal increases, the permittivity of the ferroelectric material increases decreasing the velocity of propagation through the branch line. The electrical length of the branch line is increased. The branch line impinges a finite impedance on the output end of the main line reducing its output signal below the level of the input signal. When the level of the input signal is high, the increase in the electrical length is a quarter-wavelength, the impedance impinged by the branch line on the output end of the main line is very small. As a result, the level of the output signal is significantly reduced below the level of the input signal. To provide limiting at different levels of input signals, more than one branch line can be connected to the main line.

In a second embodiment, the first part of the branch line or stub is a half-wave low loss dielectric line. At the end of the branch line, a line of ferroelectric material, d.c. biased to a low permittivity, is connected. At the other end of the ferroelectric line, a low loss dielectric transmission line of appropriate length is connected providing an inductance. The other end of the dielectric line is connected to a large capacitor formed by the same ferroelectric material as used in the earlier section or by a dielectric material of high permittivity producing an RF short circuit. When the level of the input signal is low, the capacitance of the ferroelectric line resonates with the inductance producing a high impedance. This produces a high impedance across the output end of the main transmission line without reducing the output impedance and the level of the output signal significantly below the level of the input signal. As the level of the input signal increases, the permittivity and the capacitance of the ferroelectric line are increased. The branch line impinges a finite impedance on the output end of the main transmission line reducing the output impedance and the signal level below the level of the input signal. To increase the dynamic range or the operating range of signal level of the limiter, multiple branch lines are used.

Waveguide embodiments are also disclosed. In series with a main waveguide, one or more branch guides are connected. One branch guide is a waveguide half a wavelength long. Other branch guides, one or more half wavelengths long at the operating frequency of the limiter, are tapered guides. On the branch guide, one or more half wavelengths long at the operating frequency of the limiter, a ferroelectric rod or slab is mounted forming a variable capacitance of a parallel resonant circuit tuned to the operating frequency of the limiter. Behind the ferroelectric rod or slab is an appropriate long branch guide, short circuited at the end, forming an inductance of a parallel resonant circuit tuned at the operating frequency of the limiter. At a low signal level, the parallel resonant circuit is off resonance and presents a low impedance at the junction of the main waveguide and the branch guide producing a very low loss to the input signal. At a large level of signal, the variable capacitance of the ferroelectric rod or slab and the inductance of the short circuited branch guide form parallel resonance and presents a high impedance at the junction of the main waveguide and the branch guide and reduces the level of the output signal introducing limiting. In place of the variable capacitance and inductance embodiment, a resonant cavity is also used.

The ferroelectric material could be a ferroelectric liquid crystal material or a solid including potassium-tantalum-niobate, strontium titanate and a mixture of strontium titanate and lead titanate.

With these and other objectives in view, as will hereinafter be more particularly pointed out in the appended claims, reference is now made to the following description taken in connection with accompanying diagrams.

DESCRIPTION OF THE DRAWINGS

FIG. 1. Pictorial description of a waveguide limiter.

FIG. 2. Cross-section of a reduced height branch guide.

FIG. 3. Cross-section of a reduced height branch guide made of a single crystal dielectric material.

FIG. 4. Cross-section of a branch guide with the ferroelectric material biased at one end.

FIG. 5. Cross-section of a branch guide with a ferroelectric material with no bias.

DETAILED DESCRIPTION OF FERROELECTRIC LIMITER

Figure 6:
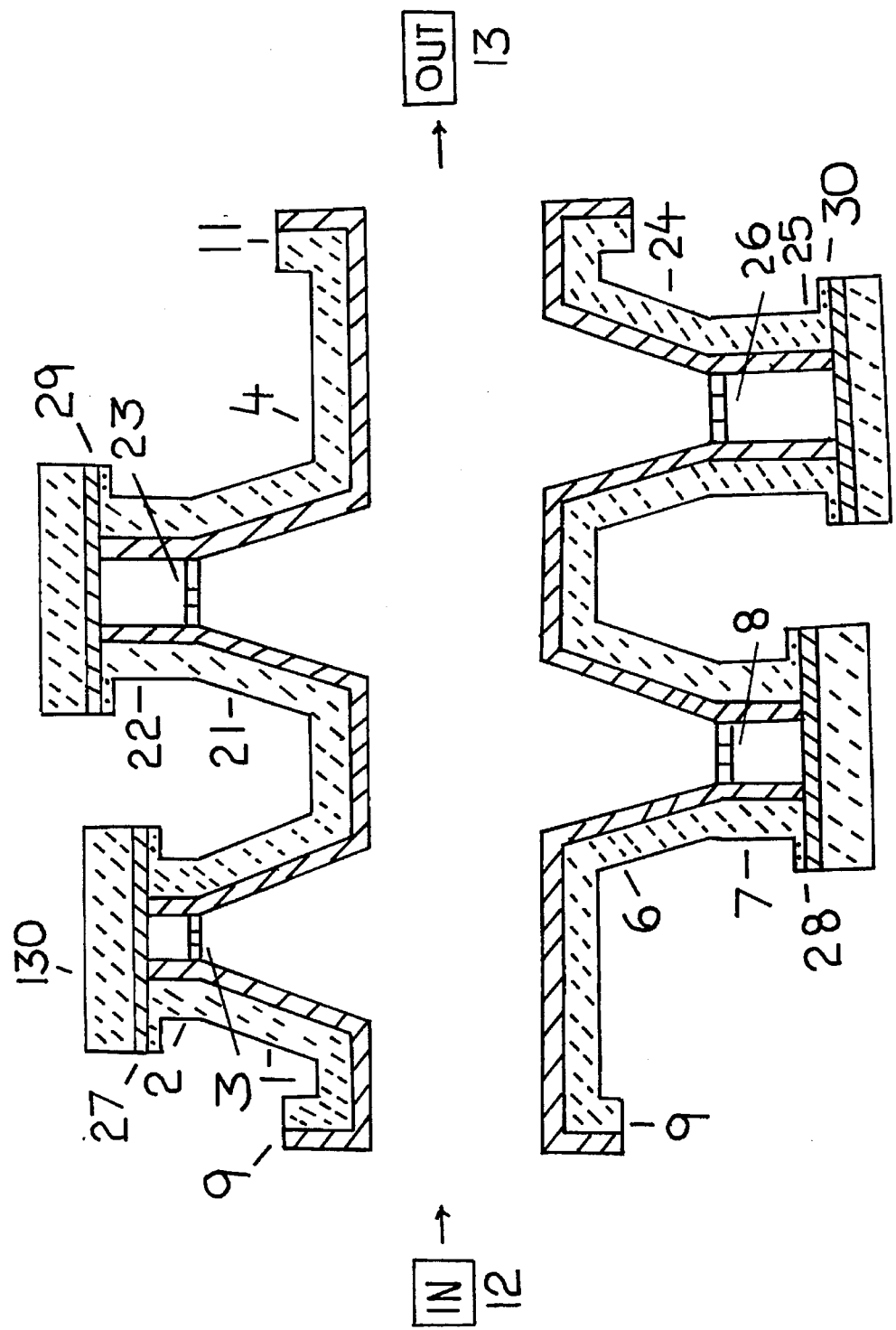
FIG. 6. Cross-section of a large dynamic range waveguide limiter.

Now referring to FIG. 1, 10 is the waveguide limiter. The waveguide is 4. A tapered branch line or series stub 1 is connected to the main guide. The minimum length of the said stub 1 is one half wavelength. When a longer stub 1 is needed, the length of the stub is a multiple of half wavelengths. The purpose of the taper is to reduce the height of the stub. At a distance of one half wavelength or a multiple of it from the main guide, a ferroelectric material 3 is connected. The ferroelectric material 3 could be a thin slab, a rectangular, a square or a cylindrical rod. The ferroelectric material is biased to a low value of permittivity and loss tangent. With increasing value of the RF signal in the waveguide, the permittivity of the ferroelectric material 3 increases providing a capacitance C at a large RF signal. Behind the ferroelectric material 3, there is an appropriate length of a short circuited reduced height branch waveguide or stub 2 having an inductance L. The inductance L of the short circuited stub 2 and the very large signal capacitance C of the ferroelectric material form parallel resonance, at the operating frequency of the limiter, providing a large impedance at the junction of the main guide and the branch guide. This produces a large loss to the input signal and the output is reduced. The input is 12 and the output is 13. The waveguide flanges are 9 and 11. 8 is a ferroelectric material, 6 is a tapered guide and 7 is a reduced height branch guide.

In the absence of the RF signal, the parallel resonant circuit is away from resonance and has a low impedance. The impedance presented at the junction of the main waveguide and the branch guide by the branch waveguide is low. By selecting a different value for the zero signal capacitance of the ferroelectric material, the level at which limiting starts can be changed. By selecting a low value of permittivity of the ferroelectric material at no or small level of signal, the dielectric loss is also reduced. The ferroelectric material can be designed to work without or with a low bias voltage having a larger permittivity and a larger loss tangent. With increasing level of signal, the permittivity is reduced. The length of the reduced height branch guide is designed so that its inductance resonates with the very large signal value of the capacitance of the ferroelectric material.

In FIG. 2, the mounting of the ferroelectric material is shown in an enlarged drawing. To prevent any movement of the ferroelectric material 3, when the limiter is vibrated, a screw 19, locked by a nut 18, can be used against the ferroelectric material 3. The bias voltage is supplied by the wire 17. This approach of FIG. 2 to apply the bias voltage at the middle of the ferroelectric material, requires the ferroelectric material to be cut at the middle and the top, bottom and middle are to be properly coated with a conductive coating. The purpose of making a reduced height stub line is to reduce the magnitude of the bias voltage. The bias wire 17 is insulated by an insulator 16. One side of the reduced height branch waveguide or stub is 15. Another approach is to bias the ferroelectric at one end. In FIG. 1, the main guide and the branch guide are made of a conductor or a high Tc superconductor material.

The main waveguide and the branch guide can be made of a single crystal dielectric material including sapphire, lanthanum aluminate. The interior conductive surfaces of the waveguide and the branch guide are coated with a film of a single crystal high Tc superconductor material. The waveguide pieces are connected by brazing or by a similar method.

In FIG. 3, this embodiment is depicted. The outer section of the stub guide is the dielectric material 20. The interior surfaces of the dielectric guide 15 are coated with a single crystal high Tc superconductor material.

To improve the performance of the limiter, a second stub guide 6 is connected to the waveguide 4 as shown in FIG. 1. The center of the second branch guide is one or two half wavelengths away from the center of the first branch guide. The tapered portion of the branch guide is 6 and is one or more half wavelengths long. The ferroelectric material 8, with a length larger than that of 3, is connected across the branch guide one or more half wavelengths from the main waveguide. The ferroelectric material 8 is a slab, a rectangular, a square or a cylindrical rod. The capacitance of the ferroelectric material is C1 at a large level of signal. The short circuited reduced height, higher and longer than the branch guide 2, branch, guide 7 forms an inductance L1. At a level of signal, larger than that required for 3, the capacitance of the ferroelectric material C1 and the inductance L1 of the short circuited stub form parallel resonance, at the operating frequency of the limiter, producing a large impedance at the junction of the main waveguide and the second branch guide. At a low level of signal, the tuned circuit is off resonance and presents a low impedance and as such a low loss at the junction of the main waveguide and the second branch guide.

A third and a fourth guide can be connected on the main waveguide with a separation of one or more half wavelength between their centers on one or the other side of the main waveguide depending on the requirements of the limiter.

The conducting wire 17 for the bias voltage is practically at zero RF voltage outside the main waveguide as the electric field is zero on the inner wall near the insulator 16. If needed, an inductance L2 can be connected in series with 17 to provide a high impedance to any RF field and a shunt capacitance C2 after the inductance L2 to short circuit any RF remaining after the filter inductance.

The reduced height branch guide 2 can be terminated at a flange 27. A separate short circuit 130 can be connected across the flange 27. This facilitates the introduction of the ferroelectric material.

In FIG. 4 is depicted a ferroelectric material 3 biased at one end. In this embodiment, the outer section of the guide 20 is a single crystal dielectric material the interior conducting surfaces of which are coated with a film of a high Tc superconducting material 14.

In FIG. 5 is depicted a ferroelectric material 3 without any bias electric field. In this embodiment, the outer sections of the guide 20 are made of a single crystal dielectric the interior conducting surfaces of which are coated with a film of high Tc superconducting material. When the ferroelectric material is used without any bias or a small bias, the zero signal permittivity and the loss tangent of the ferroelectric material are high. At a large signal, the permittivity of the ferroelectric material is reduced to a lower value.

In FIG. 6 is depicted a four stub waveguide limiter to increase the dynamic range or to increase the range of level of input signal over which the limiter can operate. The main waveguide, of appropriate length, is 4. The tapered branch guides are 1, 6, 21 and 24. The short circuited reduced height guides, forming inductances of a parallel resonant circuit tuned to the operating frequency of the limiter, are 2, 7, 22 and 25. The ferroelectric rod 3 is the shortest. The ferroelectric rod 8 is longer than 3. The ferroelectric rod 23 is longer than 8. The ferroelectric rod 26 is longer than 23. The ferroelectric rod 3 starts limiting at the lowest level of the input signal. The ferroelectric rod 8 starts limiting at a level of signal higher than the level at which 3 starts limiting. The ferroelectric rod 23 starts limiting at a level of signal higher than the level at which 8 starts limiting. The ferroelectric rod 26 starts limiting at a level of input signal higher than the level at which 23 starts limiting. The guide flanges are 27, 28, 29 and 30. The reduced height branch guides are terminated in flanges for ease of introduction of the ferroelectric rods or slabs. Separate short circuit plates are connected across the reduced height branch guide flanges. The centers of the adjacent tapered guides, on the main waveguide, are separated by one or two half wavelengths at the operating frequency of the limiter. The length of the tapered guides are one or more half wavelengths at the operating frequency of the limiter. This length is dependent on getting a good performance taper over the shortest length. Because the capacitances of the ferroelectric rods 3, 8, 23 and 26 are progressively lower, the lengths and inductances of the branch guides 2, 7, 22 and 25 are progressively larger to tune at the operating frequency of the limiter.

Figure 7:
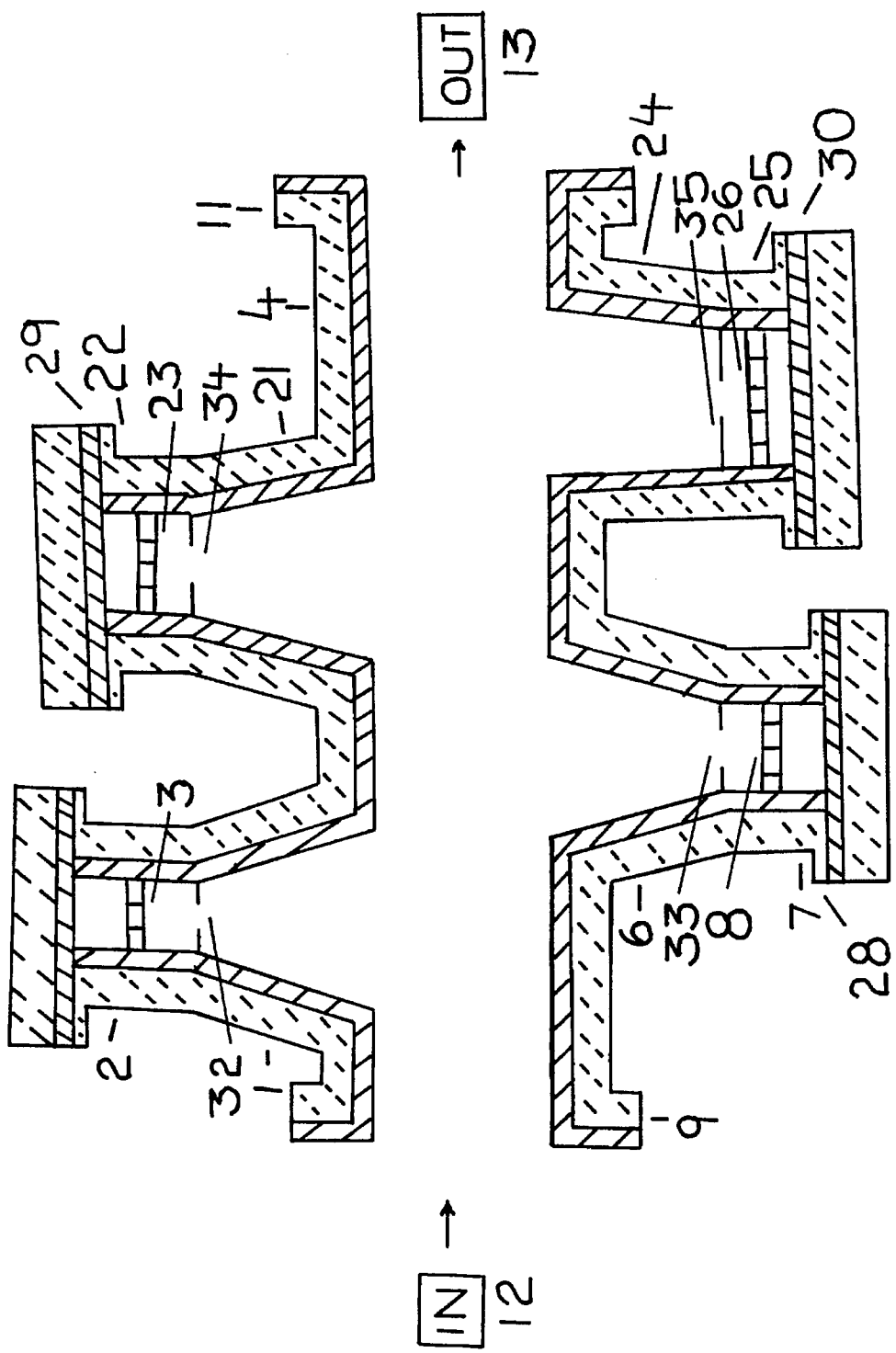
FIG. 7. Cross-section of a large dynamic range waveguide limiter with resonant cavities.

In FIG. 7 is depicted an iris-coupled resonant cavity at the end of the tapered branch guide. The tapered guides are 1, 6, 21 and 24. The coupling irsises are 32, 33, 34 and 35. The ferroelectric rods or slabs are 3, 8, 23 and 26 and of increasing height and they are placed in the center of the resonant cavities at the point of the maximum electric field. The cavities are tuned to the dominant TE10 mode at the operating frequency of the limiter. At zero or a low level of input signal, the cavity is off resonance and presents a short circuit or a low impedance at the junction of the main waveguide and the tapered branch guide.

At a designed level of the input signal, the dielectric constant of the ferroelectric material changes and the cavity is in resonance producing a high impedance at the junction of the main waveguide and the tapered branch guide reducing the output signal and introducing limiting. The ferroelectric rod or slab 3 starts limiting at the lowest level of input signal and the ferroelectric rod or slab 26 starts limiting at the highest level of the input signal. Other design factors are the same as discussed with FIG. 6. Because the capacitance of the ferroelectric rods 3, 8, 23 and 26 are progressively lower, the lengths of the cavities 2, 7, 22 and 25 are progressively lower to be resonant at the operating frequency of the limiter.

Figure 8:
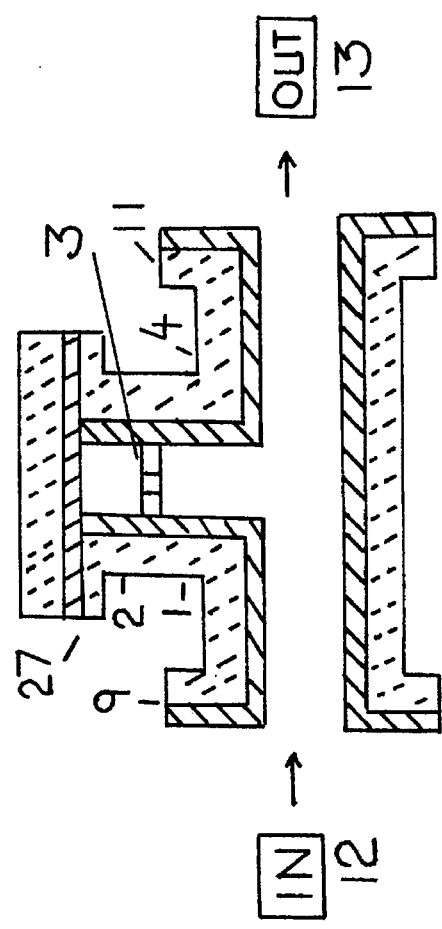
FIG. 8. Cross-section of a limiter with a branch guide same as the main waveguide and inductance capacitance resonance.

In FIG. 8 is depicted an embodiment in which limiting takes place at a high power level. The main waveguide is 4. The branch guide 1 is one half wavelength long and at that point, a ferroelectric rod or slab is mounted forming a variable capacitor of a parallel resonant circuit tuned to the operating frequency of the limiter. Behind the ferroelectric rod or slab is the full height branch guide 2, of appropriate length, to form an inductance of a parallel resonant circuit tuned to the operating frequency of the limiter. The full height branch guide is terminated in a flange 27 for ease of introduction of the ferroelectric rod or slab 3. The full height branch guide 2 is shorted with a short circuit connected across the branch guide flange 27. At a low level of input signal, there is no resonance of the ferroelectric material 3 capacitance and the inductance of the short circuited full height branch guide 2. The impedance presented at the junction of the main waveguide at the branch guide is low and there is a small loss of the input signal. At a large level of input signal, the capacitance of the ferroelectric rod or slab resonates with the inductance of the short circuited full height branch guide 2 at the operating frequency of the limiter. A high impedance is presented at the junction of the main waveguide and the branch guide and the input signal is attenuated introducing limiting. The biasing arrangements are the same as those discussed with FIGS. 2, 3, 4 and 5.

Figure 9:
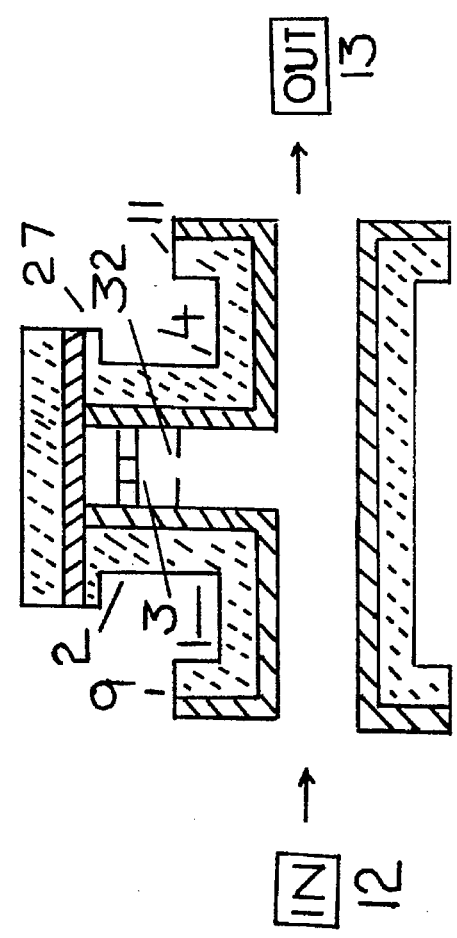
FIG. 9. Cross-section of a limiter with a branch guide same as the main waveguide and a resonant cavity.

In FIG. 9 is depicted a resonant cavity 2 at the branch guide 1. A coupling iris 32 is used for coupling the loaded resonant cavity tuned to the dominant TE10 mode at the operating frequency of the limiter. The iris is located one half wavelength from the main waveguide. The ferroelectric rod is placed at the center of the resonant cavity at the point of the maximum electric field. The cavity is tuned to the dominant TE10 mode at the operating frequency of the limiter. At a zero or a low level of input signal, the cavity is off resonance and presents a short circuit or a low impedance at the junction of the main waveguide and the branch guide.

At a designed level of the input signal, the dielectric constant of the ferroelectric material changes and the cavity is in resonance producing a high impedance at the junction of the main waveguide and the branch guide reducing the output signal and introducing limiting.

Figure 10:
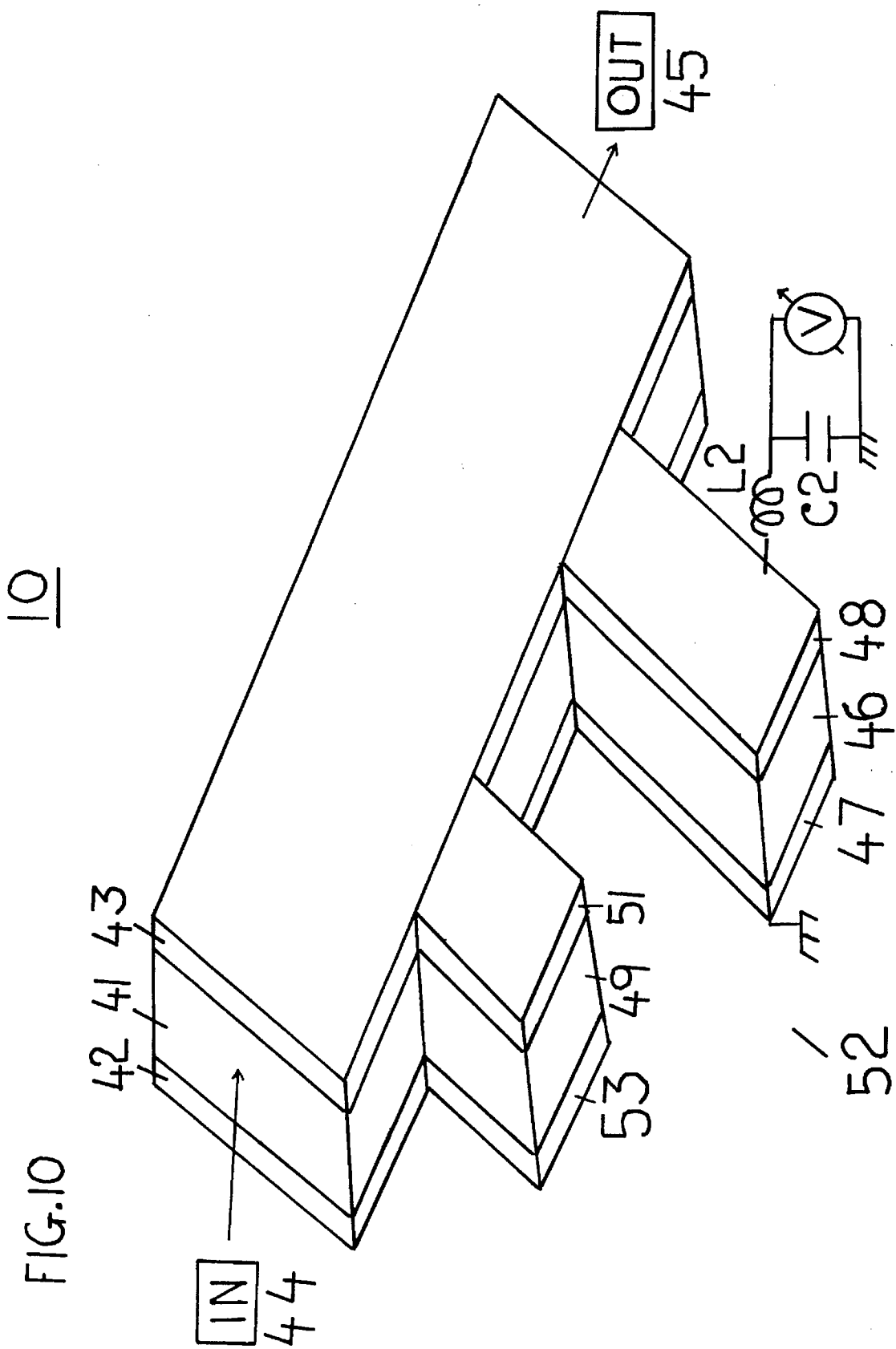
FIG. 10. Schematic drawing of a two branch line limiter.

There is illustrated in FIG. 10 a typical microwave or millimeter wave circuit configuration that incorporates the principles of the present invention. Circuit 10 includes an RF input 44, an RF transmission line 52 and an RF output 45.

The circuit 10 might be part of a cellular, terrestrial, microwave, satellite, radio determination, radio navigation or other telecommunication system. The RF input 44 may represent a signal generator which launches a telecommunication signal on to a transmission line 52 for transmission and an output 45.

The ferroelectric RF limiter is made of a low loss dielectric material 41, two or more half-wavelengths long with conductive coatings on the top 43 and bottom 42 surfaces.

The transmission line 52 contains at least one branch line 46, two or more half-wavelengths long and a half wavelength from one end of the main transmission line, of a ferroelectric material which is d.c. biased to a lower value of permittivity. Conductive coatings are placed on top 48 and bottom 47 surfaces of the ferroelectric medium 46. At a very low level of signal, the branch line impinges a high impedance on the output end of the main transmission line and causes no impact on the signal flow. With the level of input signal increasing, the permittivity of the ferroelectric material is increased decreasing the wavelength and increasing the electrical length of the branch line. As a result, the branch line impinges decreasing impedance on the output end of the main transmission line impeding the signal flow. At a high level of the input signal when the electrical length of the branch line is increased by a quarter-wave, a very low impedance is presented by the branch line on the output end of the main transmission line significantly reducing the level of the output signal below the level of the input signal.

For a level of the input signal, the actual change in the electrical length of the branch ferroelectric transmission line is a function of the zero signal electrical length of the ferroelectric transmission line. The length of a branch ferroelectric transmission line of electrical length of half a wavelength is changed by a quarter wavelength at a large level of input signal. At that level of the input signal, the change in length of a two half wavelengths long ferroelectric transmission line is half a wavelength, the change in length of a three half wavelengths long ferroelectric transmission line is three quarter wavelengths, the change in length for a four half wavelengths long ferroelectric transmission line is four quarter wavelengths and so on. The longer the zero signal level electrical length of the ferroelectric branch transmission line is, the longer is the change in the electrical length of the branch line for the same level of the input signal. Conversely, to change the length of a zero signal two half wavelengths long ferroelectric branch transmission line by a quarter wavelength requires a lower level of input signal than that required to change a zero signal one half wavelength long ferroelectric branch transmission line by a quarter wavelength. To change the length of a zero signal three half wavelengths long ferroelectric branch transmission line by a quarter wavelength requires a lower level of input signal than that required to change a zero signal two half wavelengths long ferroelectric branch transmission line by a quarter wavelength. The longer the zero signal level electrical length of a ferroelectric branch line is, the lower the level is required for the input signal for a particular actual change in the electrical length of the ferroelectric transmission line.

To provide limiting at a different level of the input signal, the transmission line 52 can contain a second 49 or more branch lines, shorter than the branch line 46 and one or more half-wavelengths long, of a ferroelectric material. The branch line 49 performs in a way similar to the branch line 46, except that the limiting takes place at a different level of input signal. The top 51 and bottom 53 surfaces of the branch line 49 are coated with a conductive material.

A d.c. voltage V is applied to the ferroelectric medium. The inductance L2 provides a high impedance to the RF energy. The capacitance C2 provides a short circuit path to any RF energy remaining after the inductance L2.

Figure 11:
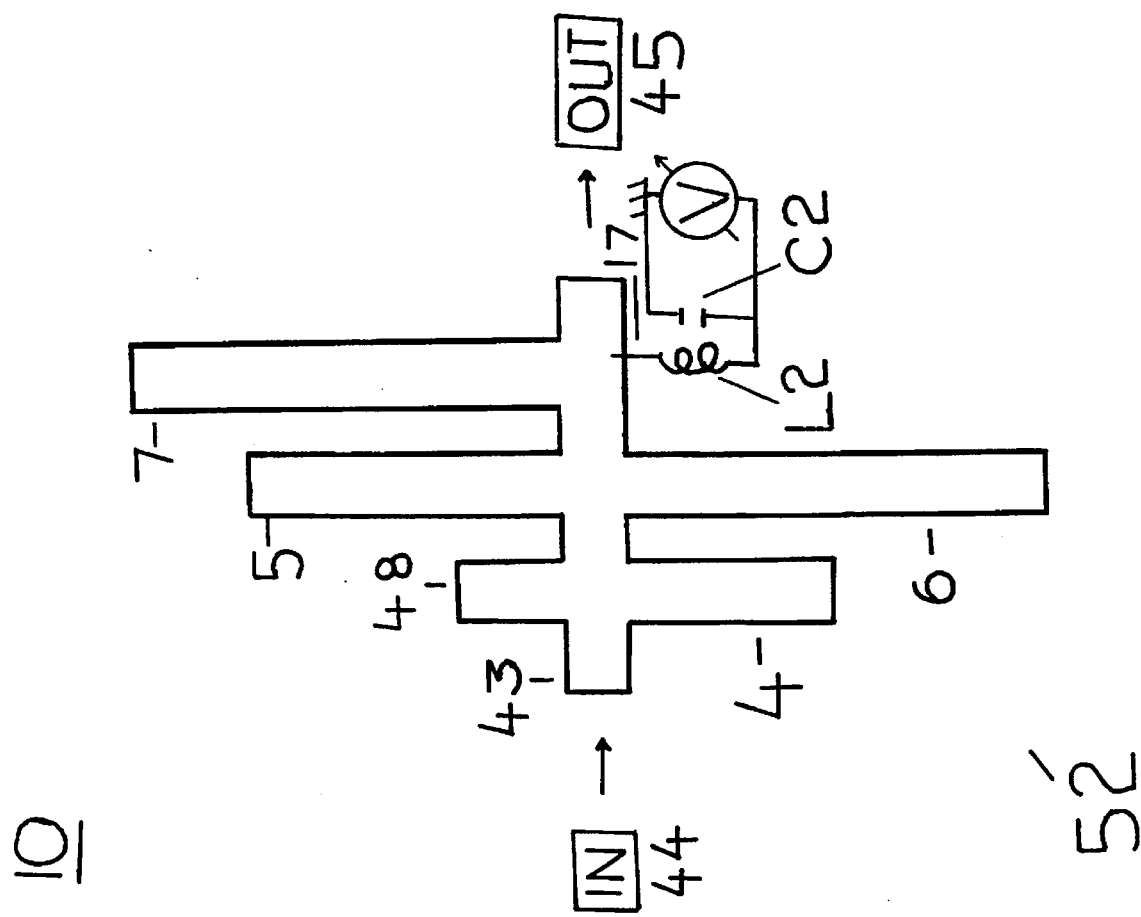
FIG. 11. Schematic top view of a large dynamic range microstrip line limiter with the same impedance branch lines.

In FIG. 11 is depicted a limiter having a large dynamic range or a large range of signal level over which limiting takes place. The main transmission line 43 is four half wavelengths, at the operating frequency of the limiter, long. A first branch transmission line 48 of a ferroelectric material one or more half wavelengths long, at the operating frequency of the limiter, is connected one half wavelength, at the operating frequency of the limiter, away from one end of the main transmission line. At a zero signal level, the first branch transmission line 48 presents a very high impedance on the main transmission line 43. As the level of signal increases, the length of the first branch line changes and presents a finite impedance on the main transmission line introducing a loss and reducing the output signal. A second branch transmission line 54, longer than the first branch line and two or more half wavelengths long at the operating frequency of the limiter, of a ferroelectric material is connected on the other side of the main transmission line also one half wavelength from one end. At a zero level of the input signal, the second branch transmission line presents a high impedance on the main transmission line. At a level of the input signal, lower than that required for the first branch line, the second branch transmission line presents the same finite impedance as the first branch transmission line, on the main transmission line producing a loss and reducing the output signal and causing limiting. A third branch line 55, larger than the second branch line and three or more half wavelengths long at the operating frequency of the limiter, of a ferroelectric material, is connected two half wavelengths, at the operating frequency of the limiter, from one end of the main transmission line 43. At a zero signal level of the input signal, the third branch line 55 produces a high impedance on the main transmission line 43. At a level of input signal, lower than that required for the second branch line, the third branch transmission line 55 presents the same finite impedance as the second branch transmission line, on the main transmission line producing a loss and reducing the output signal and causing limiting. A fourth branch line 56, larger than the third branch line and four or more half wavelengths long at the operating frequency of the limiter, of a ferroelectric material, is connected two half wavelengths, at the operating frequency of the limiter, from one end and on the other side of the main transmission line 43. At a zero signal level of the input signal, the fourth branch line 56 produces a high impedance on the main transmission line 43. At a level of input signal, lower than that required for the third branch line, the fourth branch transmission line 56 presents the same finite impedance as the third branch transmission line, on the main transmission line producing a loss and reducing the output signal and causing limiting. A fifth branch line 57, larger than the fourth branch line and five or more half wavelengths long at the operating frequency of the limiter, of a ferroelectric material, is connected three half wavelengths, at the operating frequency of the limiter, from one end of the main transmission line 43. At a zero signal level of the input signal, the fifth branch line 57 produces a high impedance on the main transmission line 43. At a level of input signal, lower than that required for the fourth branch line, the fifth branch transmission line 57 presents the same finite impedance as the fourth branch transmission line, on the main transmission line producing a loss and reducing the output signal and causing limiting.

The voltage developed across a transmission line, for an input signal level, is a function of the impedance of the transmission line. The square of the voltage developed across a transmission line is equal to the signal power across the transmission line multiplied by the impedance of the transmission line. For a specified input signal power level, the voltage across the transmission line increases with increasing impedance of the transmission line.

Figure 12:
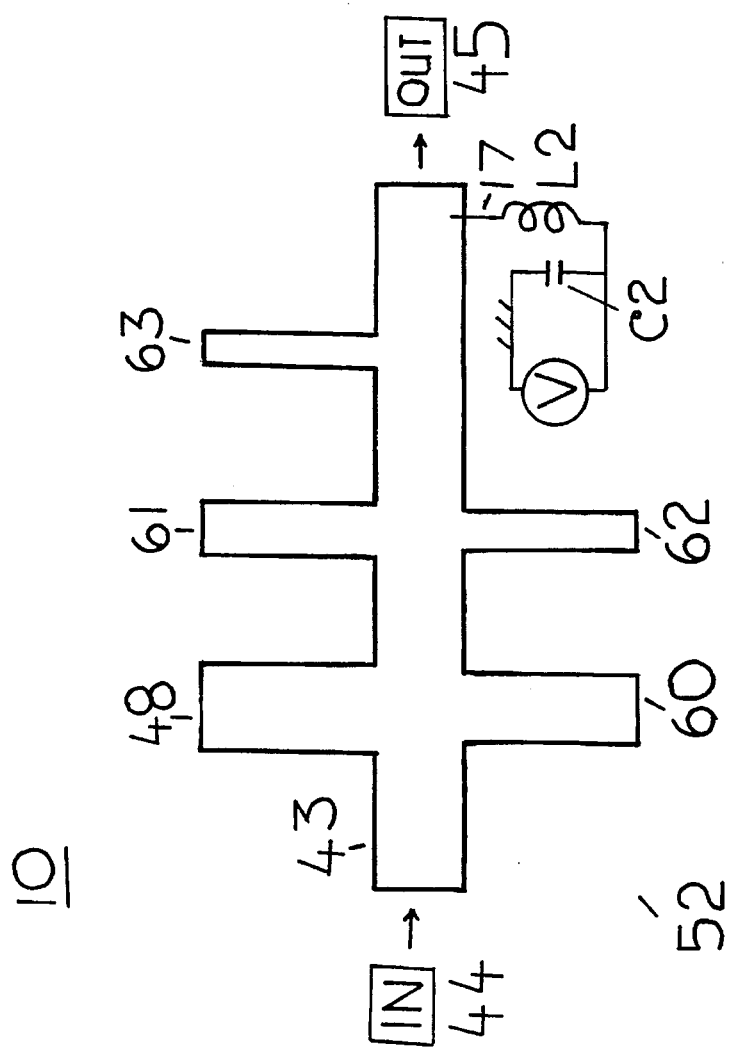
FIG. 12. Schematic top view of a large dynamic range microstrip line limiter with the branch lines having different impedances.

In FIG. 12 is depicted a limiter having a large dynamic range or a range of input signal level over which limiting takes place. It includes a main transmission line 43 and five branch ferroelectric transmission lines 48, 60, 61, 62 and 63 with increasing impedance and each a half wavelength long at the operating frequency of the limiter. The main transmission line 43 is made of a dielectric material and is four half wavelengths long at the operating frequency of the limiter. A first ferroelectric branch transmission line 48 is a half wavelength long at the operating frequency of the limiter and is connected one half wavelength, at the operating frequency of the limiter, from one end of the main transmission line. It causes limiting at a particular level of the input signal. A second ferroelectric branch transmission line 60, having an impedance higher than that of the first branch line 48, is a half a wavelength long at the operating frequency of the limiter, and is connected one half wavelength, at the operating frequency of the limiter, from one end and on the other side of the main transmission line. This branch line 60 causes limiting at an input signal level lower than that required for the first branch line 48. A third ferroelectric branch transmission line 61, having an impedance higher than that of the second branch transmission line 60, is a half wavelength long, at the operating frequency of the limiter, and is connected two half wavelengths, at the operating frequency of the limiter, from one end of the main transmission line. The third ferroelectric branch line 61 causes limiting at a level of the input signal lower than that causing limiting by the second branch line 60. A fourth ferroelectric branch transmission line 62, having an impedance higher than that of the third branch transmission line 61, is a half wavelength long, at the operating frequency of the limiter, and is connected two half wavelengths, at the operating frequency of the limiter, from one end and on the other side of the main transmission line. The fourth ferroelectric branch line 62 causes limiting at a level of the input signal lower than that causing limiting by the third branch line 61. A fifth ferroelectric branch transmission line 63, having an impedance higher than that of the fourth branch transmission line 62, is a half wavelength long, at the operating frequency of the limiter, and is connected three half wavelengths, at the operating frequency of the limiter, from one end of the main transmission line 43. The fifth ferroelectric branch line 63 causes limiting at a level of the input signal lower than that causing limiting by the fourth branch line 62. The input is 44 and the output is 45. When the input is 45, the output is 44.

Figure 13:
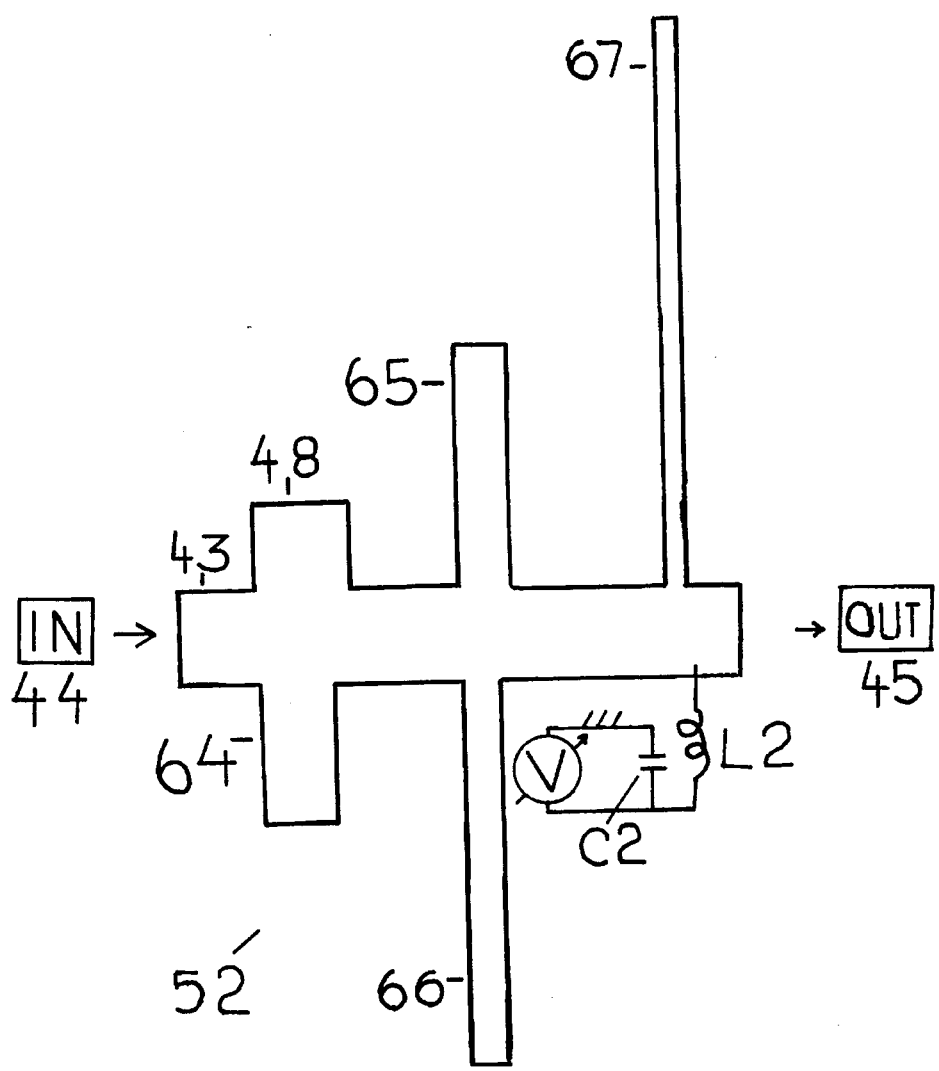
FIG. 13. Schematic top view of a large dynamic range microstrip line limiter with the branch lines having different impedances and lengths.

The different lengths of branch lines shown in FIG. 11 and the different impedances of branch lines shown in FIG. 12 are combined in FIG. 13. The main transmission line is 43 and is, for illustrative purposes, four half wavelengths long at the operating frequency of the limiter. There are five branch ferroelectric lines 48, 64, 65, 66 and 67 of increasing impedances and of increasing lengths. There could be more or less number of branch lines depending on the requirements of the limiter. The first ferroelectric line 48 has the lowest impedance and is one or more half wavelengths long at the operating frequency of the limiter and is connected one half wavelength, at the operating frequency of the limiter, from one end of the main transmission line and causes limiting at the largest level of the input signal. The second branch ferroelectric line 64 has an impedance higher than that of and is longer than the first branch transmission line 48 is two or more half wavelengths long at the operating frequency of the limiter, is connected a half wavelength, at the operating frequency of the limiter, away from and on the other side of the main transmission line and causes limiting at a level of signal lower than that required by the first branch line 48. The third branch ferroelectric line 65 has an impedance higher than and longer than the second branch transmission line 64, is three or more half wavelengths long at the operating frequency of the limiter, is connected two half wavelengths, at the operating frequency of the limiter, away from the main transmission line 43 and causes limiting at a level of signal lower than that required by the second branch line 64. The fourth branch ferroelectric line 66 has an impedance higher than and is longer than the third branch transmission line 65, is four or more half wavelengths long at the operating frequency of the limiter, is connected two half wavelengths, at the operating frequency of the limiter, away from and on the other side of the main transmission line and causes limiting at a level of signal lower than that required by the third branch line 65. The fifth branch ferroelectric line 67 has an impedance higher than and is longer than the fourth branch transmission line 66, is five or more half wavelengths long at the operating frequency of the limiter, is connected three half wavelengths, at the operating frequency of the limiter, away from the main transmission line and causes limiting at a level of signal lower than that required by the fourth branch line 66. The input is 44 and the output is 45. For an input 45, the output is 44. The inductance L2 and 02 filter the RF.

Figure 14:
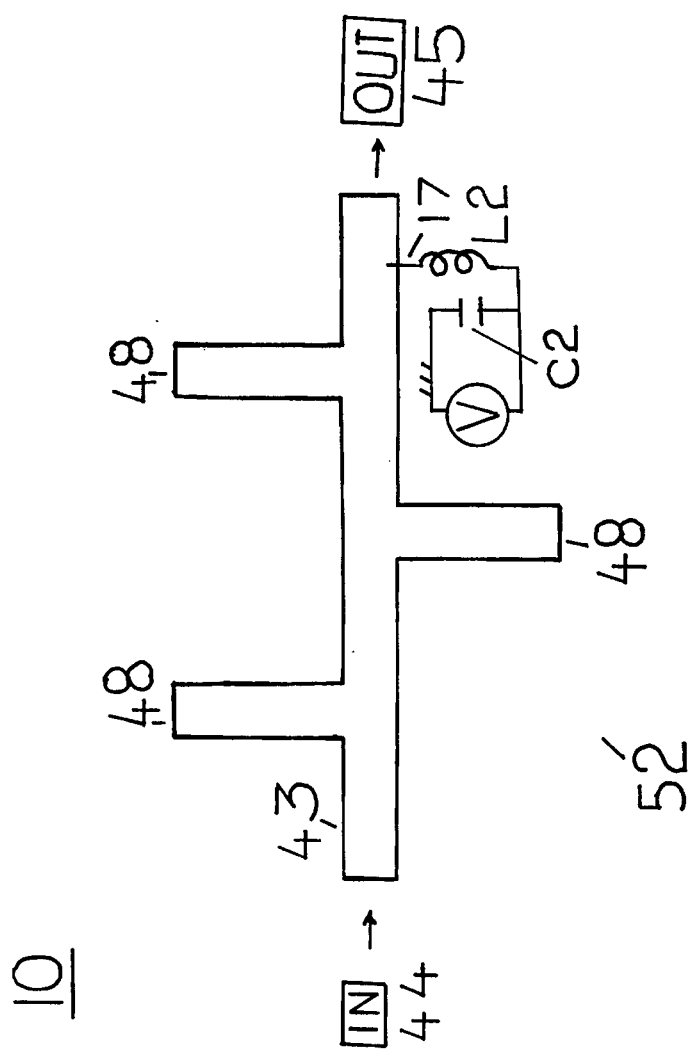
FIG. 14. Schematic top view of a limiter to increase the depth of limiting.

A special case is the protection of a satellite pre-amplifier from interfering radar signals. In FIG. 14 is depicted an embodiment for this purpose. The main transmission line is 43 and is four, for illustrative purposes, half wavelengths long at the operating frequency of the limiter and has three ferroelectric branch lines of the same length. The number of ferroelectric lines could be more or less depending on the requirements of the limiter. All the ferroelectric branch lines have the same low impedance and the same length. The first branch ferroelectric line 48 is connected one half wavelength, at the operating frequency of the limiter, from one end of the main transmission line 43 and is one or more half wavelengths long at the operating frequency of the limiter. The second ferroelectric branch line 48 has the same low impedance and the same length as the first branch line 48, is one or more half wavelengths long at the operating frequency of the limiter and is connected two half wavelengths, at the operating frequency of the limiter, from one end of the main transmission line and causes limiting at the same level of the input signal as the first branch line 48. The third branch ferroelectric branch line 48 has the same low impedance as the second branch line 48, is one or more wavelengths long at the operating frequency of the limiter and is connected three half wavelengths, at the operating frequency of the limiter, from one end of the main transmission line and causes limiting at the same level of the input signal as the second branch line 48. For two ferroelectric branch lines, the reduction of the output signal is twice or 3 dB more than that caused by one ferroelectric branch line. For three ferroelectric branch lines, the reduction of the output signal is three times or 4.7 dB more than that caused by one ferroelectric branch line.

Figure 15:
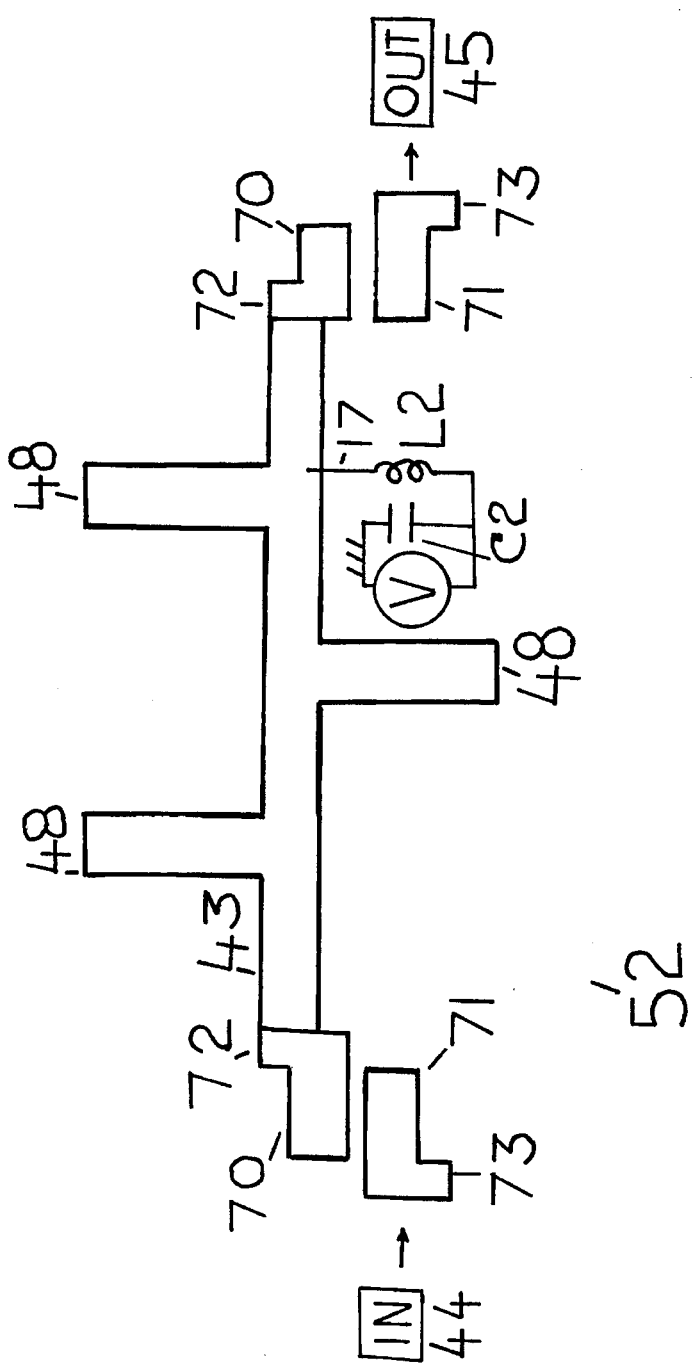
FIG. 15. Schematic top view of a limiter to increase the depth of limiting and with an input and output edge coupled filter.

In FIG. 15 is depicted the same limiter as shown in FIG. 14 with an edge coupled filter each at the input and the output for isolating the d.c. bias on the limiter from the microwave input and output circuits. Each isolating filter is composed of a quarter-wave long microstrip line 70 on the same dielectric material as that of the main line 43. A quarter-wave long, at the operating frequency of the limiter, microstrip line 71 is edge coupled to 70. For very high power operations, to prevent any arcing, the areas of the edge coupled filters can be coated with a film of the same dielectric material as that used for the main line. The microstrip line section 72 is of appropriate length of a microstrip line to isolate the coupled filter region 70 71 from the microstrip line of the main transmission line. The limiter circuit 10 of FIG. 15 can be built with films of dielectric and ferroelectric materials and the conductive coatings and conductors of the limiter can be made of a film of a single crystal high Tc superconductor material.

Figure 16:
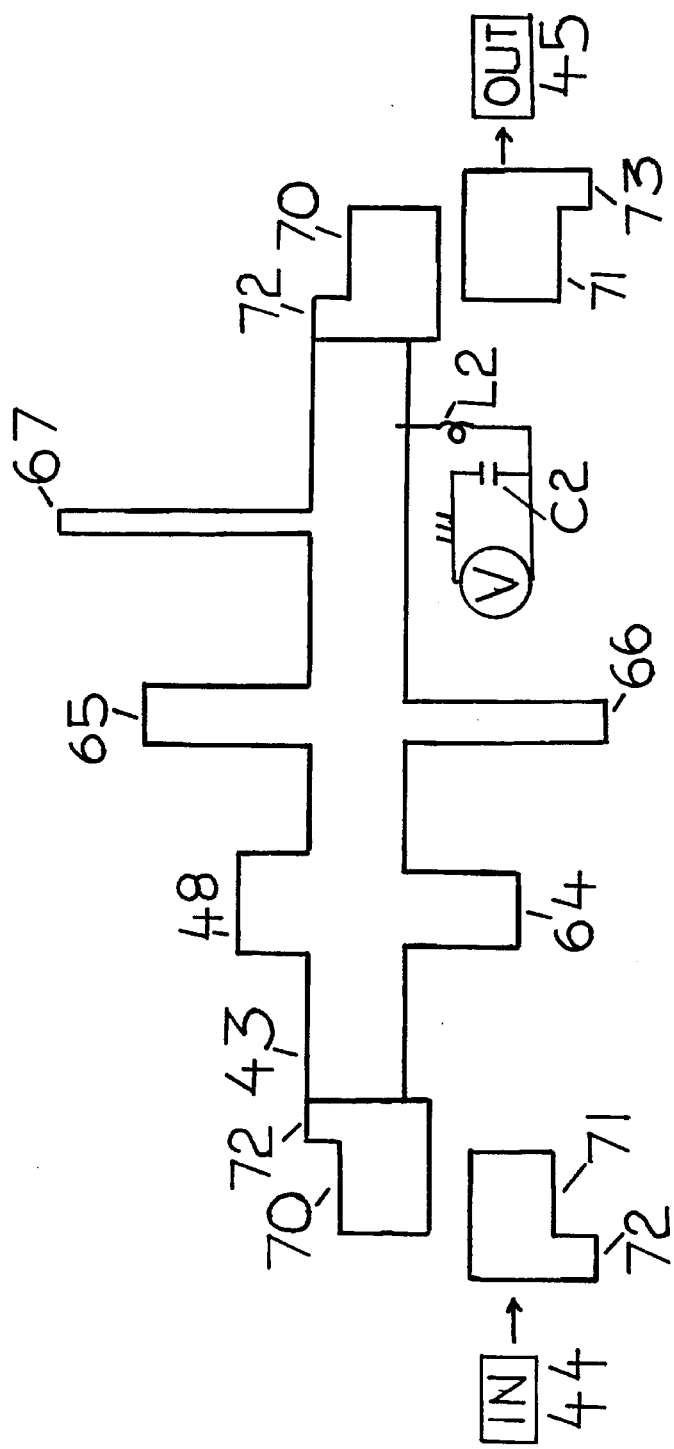
FIG. 16. Schematic top view of a large dynamic range microstrip line limiter with the branch lines having different impedances and lengths with an input and output edge coupled filter.

In FIG. 16 is depicted the same limiter circuit as shown in FIG. 13 with an edge coupled filter each at the input and the output for isolating the d.c. bias on the limiter from the microwave input and output circuits. Each isolating filter is composed of a quarter-wave long microstrip line 70 on the same dielectric material as that of the main line 43. The quarter-wave long, at the operating frequency of the limiter, microstrip line 71 is edge coupled to 70. For very high power operations, to prevent any arcing, the areas of the edge coupled filters can be coated with a film of the same dielectric material as that used for the main line. The microstrip line section 72 is of appropriate length of a microstrip line to isolate the coupled filter region 70 71 from the microstrip line of the main transmission line. The limiter circuit 10 of FIG. 16 can be built with films of dielectric and ferroelectric materials and the conductive coatings and conductors of the limiter can be made of a film of a single crystal high Tc superconductor material.

Figure 17:
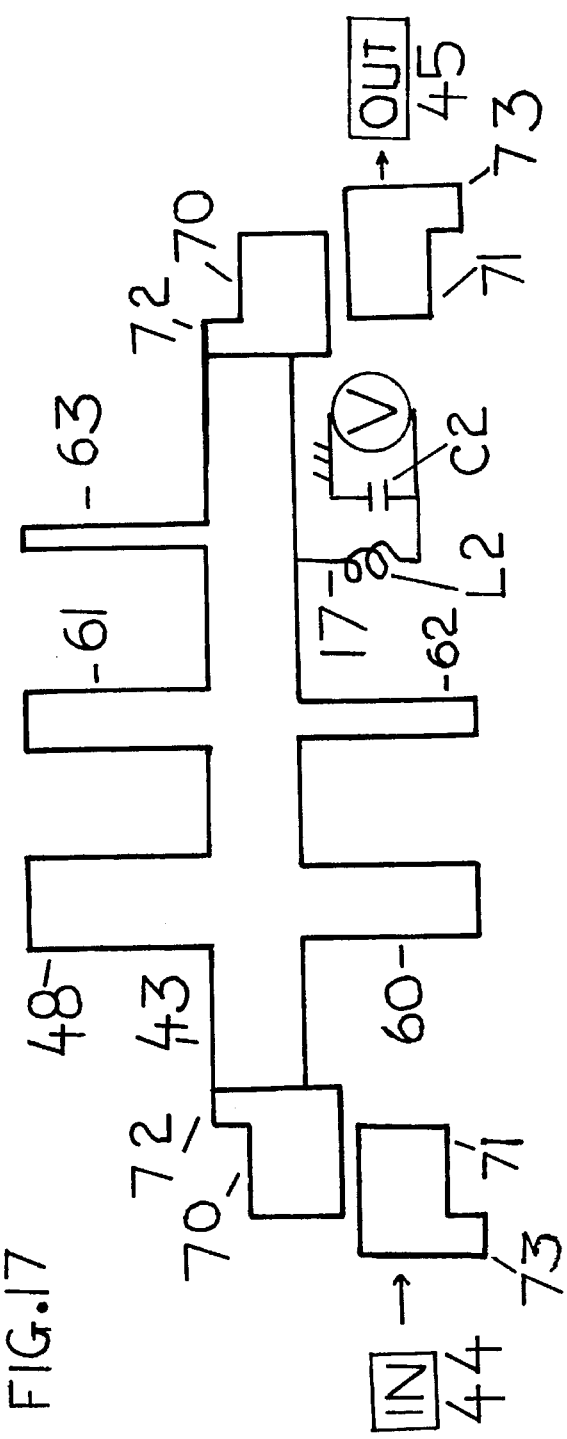
FIG. 17. Schematic top view of a large dynamic range microstrip line limiter with the branch lines having different impedances with an input and output edge coupled filter.

In FIG. 17 is depicted the same limiter circuit as shown in FIG. 12 with an edge coupled filter each at the input and the output for isolating the d.c. bias on the limiter from the microwave input and output circuits. Each isolating filter is composed of a quarter-wave long microstrip line 70 on the same dielectric material as that of the main line 43. The quarter-wave long, at the operating frequency of the limiter, microstrip line 71 is edge coupled to 70. For very high power operations, to prevent any arcing, the areas of the edge coupled filters can be coated with a film of the same dielectric material as that used for the main line. The microstrip line section 72 is of appropriate length of a microstrip line to isolate the coupled filter region 70 71 from the microstrip line of the main transmission line. The limiter circuit 10 of FIG. 17 can be built with films of dielectric and ferroelectric materials and the conductive coatings and conductors of the limiter can be made of a film of a single crystal high Tc superconductor material.

Figure 18:
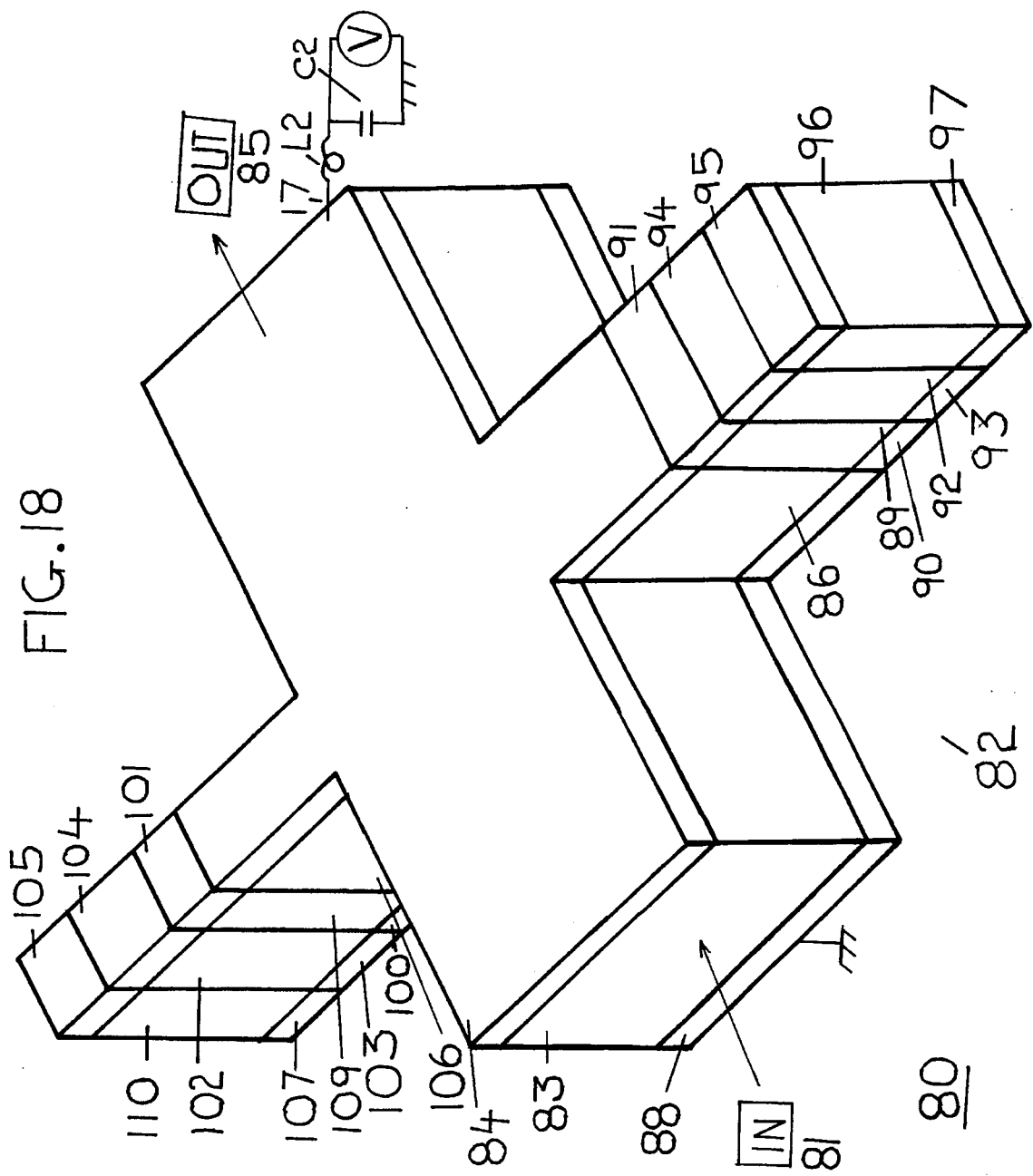
FIG. 18. Pictorial schematic drawing of a microstrip line limiter.

There is illustrated in FIG. 18 a second microwave or millimeter wave circuit configuration that incorporates the principles of the present invention. Circuit 80 includes an RF input 81, an RF transmission line 82 and an RF output 85.

The ferroelectric RF limiter is made of the low loss dielectric material 83, one wavelength long, with conductive coatings on top 84 and bottom 88 surfaces.

The transmission line 82 also contains a half-wave long first branch or stub line 86 made of the same dielectric material as 83 and placed half-a-wavelength from the end and the beginning of the main transmission line. The top 84 and bottom 88 surfaces of the branch line 86 are coated with a conductive material. At the end of the first branch line a first ferroelectric medium 89, whose permittivity is a function of the electric field across it, is connected. The top 91 and the bottom 90 surfaces of the ferroelectric medium 89 are coated with a conducting material. The ferroelectric medium is d.c. biased to a low value of permittivity. At the end of the first ferroelectric medium 89, a short first dielectric medium 92 of appropriate length is connected. The upper 94 and bottom 93 surfaces of the first dielectric medium 92 are coated with a conductive material. The dielectric medium 92 forms an inductance.

At the end of the first dielectric medium 92, a medium of ferroelectric, same as 89 or a low loss dielectric material of high permittivity is connected. The top 95 and bottom 97 surfaces of the ferroelectric or dielectric medium 96 are coated with a conductive material. The ferroelectric or dielectric medium 96 provides a high capacitance and a short circuit.

At a low level of the input signal the capacitance of the first ferroelectric medium 89 and the inductance of the first dielectric medium 92 form parallel resonance at the operating frequency of the limiter. At this level of the input signal, the branch line 86 impinges a very high impedance across the main transmission line 83 without significantly reducing the level of the output signal below the level of the input signal. As the level of the input signal 81 increases, the permittivity of the ferroelectric medium 89 and its capacitance increase. At high levels of signal, the ferroelectric medium forms a high capacitance and a very low impedance. As a result, the branch line impinges a low impedance on the main transmission line 83. The input signal 81 is transmitted to the output 85 with a very high loss.

The transmission line 82 also contains a half-wave long second branch or stub line 106 made of the same dielectric material as 83 and placed half-a-wavelength from one end and on the opposite side of the main transmission line 83. The top 84 and bottom 88 surfaces of the second branch line 106 are coated with a conductive material. At the end of the second branch line a second ferroelectric medium 109 having a higher impedance and lower capacitance than those of 89, whose permittivity is a function of the electric field across it, is connected. The top 101 and the bottom 100 surfaces of the ferroelectric medium 109 are coated with a conducting material. The ferroelectric medium is d.c. biased to a low value of permittivity. At the end of the second ferroelectric medium 109, a short second dielectric medium 102 of appropriate length, and longer than 92, is connected. The upper 104 and bottom 103 surfaces of the second dielectric medium 102 are coated with a conductive material. The dielectric medium 102 forms an inductance larger than the first dielectric medium.

At the end of the second dielectric medium 102, a medium of ferroelectric, same as 109 or a low loss dielectric material of high permittivity 110 is connected. The top 105 and bottom 107 surfaces of the ferroelectric or dielectric medium 110 are coated with a conductive material. The ferroelectric or dielectric medium 110 provides a high capacitance and a short circuit.

At a low level of the input signal the capacitance of the second ferroelectric medium 109 and the inductance of the second dielectric medium 102 form parallel resonance at the operating frequency of the limiter. At this level of the input signal, the branch line 106 impinges a very high impedance across the main transmission line 83 without significantly reducing the level of the output signal below the level of the input signal. As the level of the input signal 81 increases, the permittivity of the second ferroelectric medium 109 and its capacitance increase. At high levels of signal, lower than that required for the first ferroelectric medium 89, the ferroelectric medium 109 forms a high capacitance and a very low impedance. As a result, the branch line impinges a low impedance on the main transmission line 83. The input signal 81 is transmitted to the output 85 with a very high loss.

The impedance of the branch line 86 can be adjusted to select the level of the input signal at which limiting will start.

Figure 19:
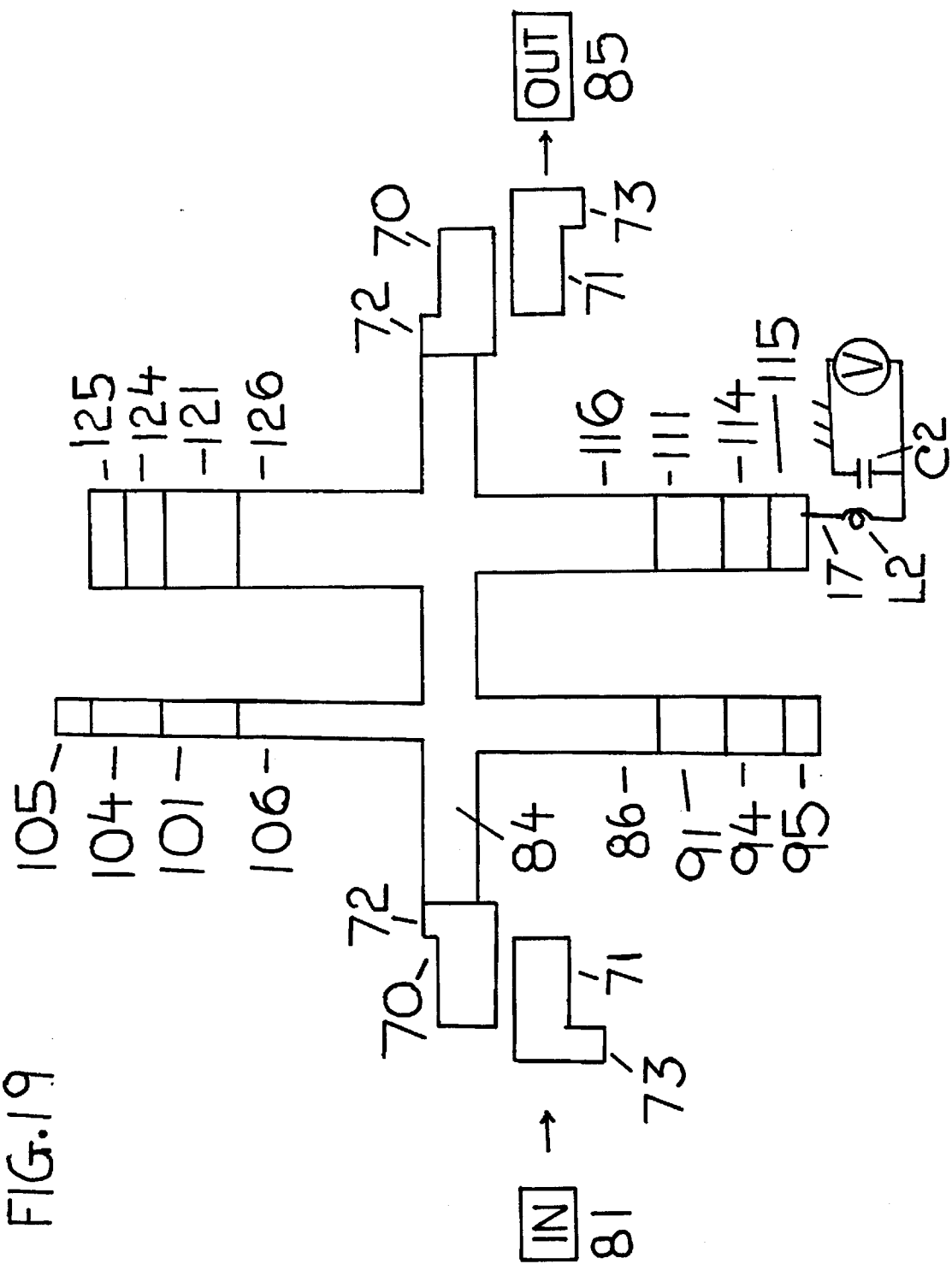
FIG. 19. Schematic top view of a large dynamic range limiter.

In FIG. 19 is depicted a limiter with a large dynamic range or a large range of level of input signal over which limiting takes place. The dielectric microstrip line 84 is three half wavelengths long, for illustrative purposes, at the operating frequency of the limiter, and has four, for illustrative purposes, branch lines. The four branch lines 86, 106, 116 and 126, each half a wavelength long at the operating frequency of the limiter, are made of the same dielectric material as the main transmission line 83. The first and the second branch circuits 86 and 106 are already discussed with FIG. 18. The third branch 116 line, made of the same dielectric material as the main transmission line 83, half a wavelength long at the operating frequency of the limiter and being connected two half wavelengths, at the operating frequency of the limiter, from one end of the main transmission line 83. The third ferroelectric microstrip line 111 has a lower impedance and a larger capacitance than that of the first ferroelectric microstrip line 91. The third dielectric microstrip line 114 has a lower length and lower inductance than those of the first first dielectric line 94. The third high permittivity microstrip line 115 is similar to 105. The capacitance of 111 and the inductance of 114 resonate at the operating frequency of the limiter at a low level of signal. At a high level of signal, higher than that required for the first resonant circuit 91 94, the third ferroelectric line forms a very high capacitance and a very low impedance introducing loss in the main transmission line and causing limiting. The fourth ferroelectric microstrip line 121 has a lower impedance and higher capacitance than the third microstrip ferroelectric line 111 and introduces limiting at a higher level of signal than that required for the third microstrip ferroelectric line 111. An edge coupled filter 70 71 each is connected at the input and the output of the limiter.

A d.c. voltage V is applied to the ferroelectric medium. The inductance L2 provides a high impedance to the RF energy. The capacitance C2 provides a short circuit path to any RF energy remaining after the inductance L2. 17 is a wire or a conductor on the substrate of the main transmission line. L2 and C2 can be built on the substrate of the main transmission line as a part of an integrated circuit.

The limiter could be designed with no or a low d.c. bias.

In order to prevent undesired RF propagation modes and effects, the height and the width of the transmission line 52 and 82 need to be controlled.

The dielectric media and the active ferroelectric media, could be in thin film configurations.

A microstrip line configuration is shown in FIGS. 10, 11, 12, 13, 14, 15, 16, 17, 18, and 19 as a discrete device. However, the same drawings will depict the ferroelectric room temperature or high Tc superconductor limiters in a monolithic microwave integrated circuit (MMIC) configuration as a part of a more comprehensive circuit. The conductive coatings are microstrip line conductors.

The limiters are also configured in a waveguide structure.

It should be understood that the foregoing disclosure relates to only typical embodiments of the invention, and that various modifications contemplated, and that numerous modifications or alternatives may be made therein by those skilled in art without departing from the spirit and the scope of the invention as set forth in the appended claims. Specifically, the invention contemplates various dielectrics, ferroelectrics shapes of ferroelectrics, bias voltages, ferroelectric liquid crystals, high Tc superconducting materials, impedances, transmission lines, waveguides, frequencies, number of branch lines and guides.

What is claimed is:

1. A ferroelectric waveguide limiter having an input, output, flanges and comprising of:

a main waveguide of appropriate length;

a first tapered branch guide being connected in series with the said main waveguide and having a length of one or more half wavelengths at the operating frequency of the limiter;

a first reduced height branch guide at the end of the tapered first branch guide;

a ferroelectric material being connected across the reduced height and in the middle of the reduced height branch guide at the junction of the tapered guide at the point of the maximum electric field, being one or more half wavelengths, at the operating frequency of the limiter, from the main waveguide forming a variable capacitor of a parallel resonant circuit tuned to the operating frequency of the limiter;

an appropriate length of the said reduced height first branch guide, behind the ferroelectric material, forming an inductance of a parallel resonant circuit tuned to the operating frequency of the limiter;

a waveguide short being connected at the end of the reduced height first branch guide;

a large level of input signal, at which the capacitance of the ferroelectric material and the inductance of the shorted reduced height first branch guide form parallel resonance tuned to the operating frequency of the limiter;

said limiter being operated slightly above the Curie temperature of the ferroelectric material; and voltage means for applying a bias electric field to the ferroelectric material to set the zero signal operating point.

2. A ferroelectric waveguide limiter of claim 1;

said main waveguide, said first tapered branch guide, said first reduced height branch guide, said waveguide short and said waveguide flanges being made from a single crystal high Tc superconductor material;

the said tapered branch guide being connected to the said main waveguide;

said flanges being connected to the main and branch guides; and means for keeping the limiter at the high Tc superconducting temperature slightly above the Curie temperature of the ferroelectric material.

3. A ferroelectric waveguide limiter of claim 1;

said main waveguide, said first tapered branch guide, said first reduced height branch guide, said waveguide short and said waveguide flanges being made of a single crystal dielectric the interior conducting surfaces of which are coated with a film of a single crystal high Tc superconductor material:

the said branch guide being connected to the said main waveguide;

said flanges being connected to the main and the branch guides; and means for keeping the limiter at the high Tc superconducting temperature slightly above the Curie temperature of the ferroelectric material.

4. A ferroelectric waveguide limiter of claim 1;

said flanges being connected to the main waveguide and the branch guide;

a second tapered branch guide being connected in series with the said main waveguide and having a length of one or more half wavelengths at the operating frequency of the limiter;

the distance between the centers of the first and second branch guides being one or more half wavelengths, at the operating frequency of the limiter, on the main waveguide;

a second reduced height, lower and shorter than the first reduced height branch guide, branch guide at the end of the second tapered branch guide;

a second ferroelectric material, shorter than the first ferroelectric material, being connected across the second reduced height and in the middle of the second reduced height branch guide at the junction of the tapered branch guide and at the point of the maximum electric field, being one or more half wavelengths, at the operating frequency of the limiter, from the main waveguide forming a variable capacitor of a parallel resonant circuit tuned to the operating frequency of the limiter;

said flanges being connected to the main waveguide and the branch guide;

at a second large level of signal, lower than the first level of signal, the capacitance of the ferroelectric material and the inductance of the shorted reduced height second branch guide form parallel resonance at the operating frequency of the limiter; and voltage means for applying a bias electric field to the second ferroelectric material to set the zero signal operating point.

5. A ferroelectric waveguide limiter of claim 1;

said main waveguide, said first tapered branch guide, said first reduced height branch guide, said waveguide short and said waveguide flanges being made of a single crystal high Tc superconductor material;

the said first branch guide being connected to the said main waveguide;

said flanges being connected to the main waveguide and the branch guide;

a second tapered branch guide being made of a single crystal high Tc superconductor material and being connected in series to the said main waveguide, and having a length of one or more half wavelengths at the operating frequency of the limiter;

the distance between the centers of the first and second branch guides being one or more half wavelengths, at the operating frequency of the limiter, on the main waveguide;

a second reduced height branch guide of lower height than the said first reduced height guide, being made of a single crystal high Tc superconductor material, at the end of the second tapered branch guide;

the said second tapered branch guide being connected to the said main waveguide;

a second ferroelectric material, being connected across the second reduced height and in the middle of the second reduced height said second branch guide at the junction of the tapered branch guide and at the point of the maximum electric field, being one or more half wavelengths, at the operating frequency of the limiter, from the said main waveguide and forming a variable capacitance of a parallel resonant circuit tuned to the operating frequency of the limiter;

the second ferroelectric material being of a lower height than the first ferroelectric material;

an appropriate length of the said second reduced height branch guide, being shorter than the first reduced height branch guide, made from a single crystal high Tc superconductor material and behind the said second ferroelectric material, and forming an inductance of a second parallel resonant circuit tuned to the operating frequency of the limiter;

a second waveguide short being made of a single crystal high Tc superconductor material and being connected at the end of the said second reduced height branch guide;

said flanges being made of a single crystal high Tc superconductor material;

said flanges being connected to the main and the branch guides;

a second large level of the input signal, lower than the first level, at which the capacitance of the said second ferroelectric material and the inductance of the said second reduced height short circuited branch guide form parallel resonance to the operating frequency of the limiter;

voltage means for applying a bias electric field to the second ferroelectric material to set the zero signal operating point; and means for keeping the limiter at the high Tc superconducting temperature slightly above the Curie temperature of the ferroelectric material.

6. A ferroelectric waveguide limiter of claim 1;

said main waveguide, said first tapered branch guide, said reduced height branch guide, said waveguide short and said waveguide flanges being made of a single crystal dielectric the interior conducting surfaces of which being coated with a film of a single crystal high Tc superconductor material;

the said first branch guide being connected to the said main waveguide;

said flanges being connected to the main and the first branch guides;

a second tapered branch guide made of a single crystal dielectric material the interior conducting surfaces of which are coated with a film of a high Tc superconductor material, being connected in series to the said main waveguide, and having a length of one or more half wavelengths at the operating frequency of the limiter;

the distance between the centers of the first and second branch guides being one or more half wavelengths, at the operating frequency of the limiter, on the main waveguide;

a second reduced height branch guide, being of shorter height than the first reduced height branch guide and being made of a single crystal dielectric material the interior conducting surfaces of which are coated with a film of a single crystal high Tc superconductor material, at the end of the second tapered branch guide;

a second ferroelectric material, being connected across the second reduced height and in the middle of the second reduced height said second branch guide at the junction of the tapered branch guide and at the point of the maximum electric field, being one or more half wavelengths, at the operating frequency of the limiter, from the said main waveguide and forming a variable capacitance of a parallel resonant circuit tuned to the operating frequency of the limiter;

the second ferroelectric material being of a shorter height than the first ferroelectric material;

an appropriate length, shorter than the first branch guide, of the said second reduced height branch guide, made from a single crystal dielectric material the interior conducting surfaces of which are coated with a film of a single crystal high Tc superconductor material and behind the said second ferroelectric material, forming an inductance of a parallel resonant circuit tuned to the operating frequency of the limiter;

the said second branch guide being connected to the said main waveguide;

a second waveguide short being made of a single crystal dielectric material the interior conducting surfaces of which being coated with a film of a single crystal high Tc superconductor material and being connected at the end of the said reduced height branch guide;

said flanges being made of a single crystal dielectric material the interior conducting surfaces of which are coated with a film of a single crystal high Tc superconductor material;

said flanges being connected to the main and the second branch guides;

a second large level of the input signal, lower than the first level, at which the capacitance of the said second ferroelectric material and the inductance of the said second reduced height short circuited branch guide form parallel resonance to the operating frequency of the limiter;

voltage means for applying a bias electric field to the second ferroelectric material to set the zero signal operating point; and means for keeping the limiter at the high Tc superconducting temperature slightly above the Curie temperature of the ferroelectric material.

7. A ferroelectric waveguide limiter of claim 1;

said main waveguide, said first tapered branch guide, said first reduced height branch guide, said waveguide short and said waveguide flanges being made of a single crystal high Tc superconductor material;

the said first branch guide being connected to the said main waveguide;

said flanges being connected to the main waveguide and the branch guide;

a second tapered branch guide being made of a single crystal high Tc superconductor material and being connected in series to the said main waveguide, and having a length of one or more half wavelengths at the operating frequency of the limiter;

a second reduced height branch guide of lower height and shorter than the said first reduced height guide, being made of a single crystal high Tc superconductor material, at the end of the second tapered branch guide;

the said second branch guide being connected to the said main waveguide;

a second ferroelectric material, being connected across the second reduced height and in the middle of the second reduced height said second branch guide at the junction of the tapered guide at the point of the maximum electric field, being one or more half wavelengths, at the operating frequency of the limiter, from the said main waveguide and forming a variable capacitance of a parallel resonant circuit tuned to the operating frequency of the limiter;

the second ferroelectric material being of a lower height than the first ferroelectric material;

an appropriate length of the said second reduced height branch guide, made from a single crystal high Tc superconductor material and behind the said second ferroelectric material, forming an inductance of a second parallel resonant circuit tuned to the operating frequency of the limiter;

a second waveguide short being made of a single crystal high Tc superconductor material and being connected at the end of the said second reduced height branch guide;

a second large level of the input signal, lower than the first level, at which the capacitance of the said second ferroelectric material and the inductance of the said second reduced height short circuited branch guide form parallel resonance to the operating frequency of the limiter;

said flanges being made of a single crystal high Tc superconductor material;

said flanges being connected to the main and the branch guides;

voltage means for applying a bias electric field to the second ferroelectric material to set the zero signal operating point;

a third tapered branch guide being made of a single crystal high Tc superconductor material and being connected in series to the said main waveguide, and having a length of one or more half wavelengths at the operating frequency of the limiter;

a third reduced height branch guide, being made of a single crystal high Tc superconductor material, at the end of the third tapered branch guide;

the said third branch guide being connected to the said main waveguide by brazing or by a similar method;

the distance between the centers of the second and third branch guides, on the main waveguide, is one or two half wavelengths at the operating frequency of the limiter;

a third ferroelectric material being connected across the third reduced height and in the middle of the third reduced height said third branch guide at the junction of the tapered guide at the point of the maximum electric field, being one or more half wavelengths from the said main waveguide, at the operating frequency of the limiter, and forming a variable capacitance of a parallel resonant circuit tuned to the operating frequency of the limiter;

the third ferroelectric material being of a lower height than said second ferroelectric material;

an appropriate length, shorter and lower height than the second branch guide, of the said third reduced height branch guide, being made from a single crystal high Tc superconductor material and being behind the said third ferroelectric material, forming an inductance of a parallel resonant circuit tuned to the operating frequency of the limiter;

a third waveguide short being made of a single crystal high Tc superconductor material and being connected at the end of the said third reduced height branch guide;

a third large level of the input signal, lower than the second level of the input signal, at which the capacitance of the said third ferroelectric material and the inductance of the said third reduced height short circuited branch guide form parallel resonance at a large signal level at the operating frequency of the limiter;

said flanges being made of a single crystal high Tc superconductor material;

said flanges being connected to the main waveguide and the branch guide;

voltage means for applying a bias electric field to the third ferroelectric material to set the zero signal operating point;

a fourth tapered branch guide being made of a single crystal high Tc superconductor material and being connected in series to the said main waveguide, and having a length of one or more half wavelengths at the operating frequency of the limiter;

a fourth reduced height branch guide of lower height and shorter than the said third reduced height guide, being made of a single crystal high Tc superconductor material, at the end of the fourth tapered branch guide;

the said fourth branch guide being connected to the said main waveguide;

a fourth ferroelectric material, being connected across the fourth reduced height and in the middle of the fourth reduced height said fourth branch guide at the junction of the tapered guide at the point of the maximum electric field, being one or more half wavelengths, at the operating frequency of the limiter, from the said main waveguide and forming a variable capacitance of a parallel resonant circuit tuned to the operating frequency of the limiter;

the fourth ferroelectric material being of a lower height than the third ferroelectric material;

an appropriate length of the said fourth reduced height branch guide, made from a single crystal high Tc superconductor material and behind the said fourth ferroelectric material, forming an inductance of a parallel resonant circuit tuned to the operating frequency of the limiter;

a fourth waveguide short being made of a single crystal high Tc superconductor material and being connected at the end of the said fourth reduced height branch guide;

a fourth large level of the input signal, lower than the third level, at which the capacitance of the said fourth ferroelectric material and the inductance of the said fourth reduced height short circuited branch guide form parallel resonance to the operating frequency of the limiter;

flanges being made of a single crystal high Tc superconductor material;

said flanges being connected to the main and the branch guides;

voltage means for applying a bias electric field to the fourth ferroelectric material to set the zero signal operating point; and means for keeping the limiter at the high Tc superconducting temperature slightly above the Curie temperature of the ferroelectric material.

8. A ferroelectric waveguide limiter of claim 1;

said main waveguide, said first tapered branch guide, said first reduced height branch guides, said waveguide short and said waveguide flanges being made of a single crystal dielectric the interior conducting surfaces of which being coated with a film of a single crystal high Tc superconductor material;

the said first branch guide being connected to the said main waveguide;

said flanges being connected to the main and the first branch guides;

a second tapered branch guide made of a single crystal dielectric material the interior conducting surfaces of which are coated with a film of a high Tc superconductor material being connected in series to the said main waveguide, and having a length of one or more half wavelengths at the operating frequency of the limiter;

a second reduced height branch guide being of lower height and shorter than the first reduced height branch guide and being made of a single crystal dielectric material the interior conducting surfaces of which are coated with a film of a single crystal high Tc superconductor material, at the end of the second tapered branch guide;

a second ferroelectric material being connected across the second reduced height and in the middle of the second reduced height said second branch guide at the junction of the tapered guide at the point of the maximum electric field, being one or more half wavelengths from the said main waveguide and forming a variable capacitance of a parallel resonant circuit tuned to the operating frequency of the limiter;

the second ferroelectric material being of a lower height than the first ferroelectric material;

an appropriate length of the said second reduced height branch guide, made from a single crystal dielectric material and behind the said second ferroelectric material, forming an inductance of a parallel resonant circuit tuned to the operating frequency of the limiter;

the said second branch guide being connected to the said main waveguide;

a second waveguide short being made of a single crystal dielectric material the interior conducting surfaces of which being coated with a film of a single crystal high Tc superconductor material and being connected at the end of the second reduced height branch guide;

said flanges being made of a single crystal dielectric material the interior conducting surfaces of which are coated with a film of a single crystal high Tc superconductor material;

said flanges being connected to the main and the second branch guides;

a second large level of the input signal, lower than the first level, at which the capacitance of the said second ferroelectric material and the inductance of the said second reduced height short circuited branch guide form parallel resonance to the operating frequency of the limiter;

voltage means for applying a bias electric field to the second ferroelectric material to set the zero signal operating point;

a third tapered branch guide made of a single crystal dielectric material the interior conducting surfaces of which are coated with a film of a high Tc superconductor material being connected in series to the said main waveguide, and having a length of one or more half wavelengths at the operating frequency of the limiter;

a third reduced height, shorter than the second, branch guide, being made of a single crystal dielectric material the interior conducting surfaces of which are coated with a film of a single crystal high Tc superconductor material, at the end of the third tapered branch guide;

a third ferroelectric material being connected across the third reduced height and in the middle of the third reduced height said third branch guide at the junction of the tapered guide at the point of the maximum electric field, being one or more half wavelengths, at the operating frequency of the limiter, from the said main waveguide and forming a variable capacitance of a parallel resonant circuit tuned to the operating frequency of the limiter;

the third ferroelectric, shorter than the second, material;

an appropriate length of the said third reduced height branch guide, made from a single crystal dielectric material and behind the said third ferroelectric material, forming an inductance of a parallel resonant circuit tuned to the operating frequency of the limiter;

the said third branch guide being connected to the said main waveguide;

a third waveguide short being made of a single crystal dielectric material the interior conducting surfaces of which being coated with a film of a single crystal high Tc superconductor material and being connected at the end of the said third reduced height branch guide;

said flanges being made of a single crystal dielectric material the interior conducting surfaces of which are coated with a film of a single crystal high Tc superconductor material;

said flanges being connected to the main and the third branch guides;

a third large level of the input signal, lower than the level of the second input signal, at which the capacitance of the said third ferroelectric material and the inductance of the said third reduced height short circuited branch guide form parallel resonance to the operating frequency of the limiter;

voltage means for applying a bias electric field to the third ferroelectric material to set the zero signal operating point;

a fourth tapered branch guide made of a single crystal dielectric material the interior conducting surfaces of which are coated with a film of a high Tc superconductor material being connected in series to the said main waveguide, and having a length of one or more half wavelengths at the operating frequency of the limiter;

a fourth reduced height branch guide being of shorter height than the third reduced height branch guide and being made of a single crystal dielectric material the interior conducting surfaces of which are coated with a film of a single crystal high Tc superconductor material, at the end of the fourth tapered branch guide;

a fourth ferroelectric material being connected across the fourth reduced height and in the middle of the fourth reduced height said fourth branch guide at the junction of the tapered guide at the point of the maximum electric field, being one or more half wavelengths from the said main waveguide and forming a variable capacitance of a parallel resonant circuit tuned to the operating frequency of the limiter;

the fourth ferroelectric material being of a shorter height than the third ferroelectric material;

an appropriate length, shorter than the third, of the said fourth reduced height branch guide, made from a single crystal dielectric material and behind the said second ferroelectric material, forming an inductance of a parallel resonant circuit tuned to the operating frequency of the limiter;

the said fourth branch guide being connected to the said main waveguide; by brazing or by a similar method;

a fourth waveguide short being made of a single crystal dielectric material the interior conducting surfaces of which being coated with a film of a single crystal high Tc superconductor material and being connected at the end of the said fourth reduced height branch guide;

said flanges being made of a single crystal dielectric material the interior conducting surfaces of which are coated with a film of a single crystal high Tc superconductor material;

said flanges being connected to the main and the fourth branch guides a fourth large level of the input signal, lower than the third level, at which the capacitance of the said fourth ferroelectric material and the inductance of the said fourth reduced height short circuited branch guide form parallel resonance to the operating frequency of the limiter;

voltage means for applying a bias electric field to the fourth ferroelectric material to set the zero signal operating point; and means for keeping the limiter at the high Tc superconducting temperature slightly above the Curie temperature of the ferroelectric material.

9. A ferroelectric limiter of claim 1;

all waveguides, branch guide, waveguide short and flanges being made of a single crystal high Tc superconductor, and said ferroelectric being a mixture of strontium titanate and lead titanate, said branch guide being connected to the said main waveguide, means for keeping said limiter at a high Tc superconducting temperature.

10. A ferroelectric limiter of claim 1;

all waveguides, irises, waveguide shorts and flanges being made of a single crystal dielectric the interior conducting surfaces of which are coated with a film of a single crystal high Tc superconductor material;

the said branch guide being connected to the said main waveguide; and means for keeping said limiter at a high Tc superconducting temperature.

11. A ferroelectric limiter of claim 1 all conductors and conductive coatings being made of room temperature conductors; and means for keeping the limiter at a room temperature.

12. A ferroelectric limiter of claim 11 wherein the ferroelectric material is a ferroelectric liquid crystal (FLC).

13. A ferroelectric limiter having an input, output, flanges and comprising of;

a main waveguide being made of a single crystal high Tc superconductor material and of appropriate length;

first tapered branch guide, terminating in a first reduced height branch guide, made of a single crystal high Tc superconductor material being connected in series to the said main waveguide, and having a length of one or more half wavelengths at the operating frequency of the limiter;

a first iris being made of a single crystal high Tc superconductor material and being placed at the end of the first tapered branch guide;

the said first tapered branch guide being connected to the said main waveguide an appropriate length of the said first reduced height branch guide, being made from a single crystal high Tc superconductor material forming a first resonant cavity tuned to the operating frequency of the limiter;

a first ferroelectric material being connected across the first reduced height and in the middle of the said first reduced height resonant cavity at the point of the maximum electric field, and forming a variable capacitance;

a first waveguide short being made of a single crystal high Tc superconductor material and being connected at the end of the said first reduced height branch guide;

a first large level of the input signal at which the first reduced height cavity loaded with the capacitance of the said first ferroelectric material forms parallel resonance at the operating frequency of the limiter;

said flanges being made of a single crystal high Tc superconductor material;

said flanges being connected to the main waveguide and the branch guide;

voltage means for applying a bias electric field to the first ferroelectric material to set the zero signal operating point;

a second tapered branch guide being made of a single crystal high Tc superconductor material and being connected in series to the said main waveguide, and having a length of one or more half wavelengths at the operating frequency of the limiter;

a second iris being made of a single crystal high Tc superconductor material and being placed at the end of the second tapered branch guide;

a second reduced height branch guide, being of lower height than the said first reduced height guide, being made of a single crystal high Tc superconductor material, at the end of the second tapered branch guide;

the said second branch guide being connected to the said main waveguide;

the distance between the centers of the first and the second branch guides, on the main waveguide, is one or two half wavelengths at the operating frequency of the limiter;

an appropriate length, longer than the first reduced branch guide, of the said second reduced height branch guide, made from a single crystal high Tc superconductor material forming a second resonant cavity tuned to the operating frequency of the limiter;

a second ferroelectric material, being connected across the second reduced height and in the middle of the second reduced height said second resonant cavity at the point of the maximum electric field, and forming a variable capacitance;

the second ferroelectric material being of a lower height than the first ferroelectric material;

a second waveguide short being made of a single crystal high Tc superconductor material and being connected at the end of the said second reduced height branch guide;

a second large level of the input signal, lower than the first level, at which the said second resonant cavity loaded with the capacitance of the said second ferroelectric material forms parallel resonance at the operating frequency of the limiter;

said flanges being made of a single crystal high Tc superconductor material;

said flanges being connected to the main and the branch guides;

voltage means for applying a bias electric field to the second ferroelectric material to set the zero signal operating point;

a third tapered branch guide being made of a single crystal high Tc superconductor material and being connected in series to the said main waveguide, and having a length of one or more half wavelengths at the operating frequency of the limiter;

a third reduced height branch guide, being of lower height than the second reduced height branch guide, being made of a single crystal high Tc superconductor material, at the end of the third tapered branch guide;

the said third branch guide being connected to the said main waveguide;

the distance between the centers of the second and third branch guides, on the main waveguide, is one or two half wavelengths at the operating frequency of the limiter;

a third iris being made of a single crystal high Tc superconductor material and being placed at the end of the third tapered branch guide;

an appropriate length, longer than the second reduced height branch guide, of the said third reduced height branch guide, being made from a single crystal high Tc superconductor material forming a third resonant cavity tuned to the operating frequency of the limiter;

a third ferroelectric material being connected across the third reduced height and in the middle of the third reduced height said third resonant cavity at the point of the maximum electric field, and forming a variable capacitance;

the third ferroelectric material being of a lower height than said second ferroelectric material;

a third waveguide short being made of a single crystal high Tc superconductor material and being connected at the end of the said third reduced height branch guide;

a third large level of the input signal, lower than the second level of the input signal, at which the said third resonant cavity loaded with the capacitance of the said third ferroelectric material forms parallel resonance at the operating frequency of the limiter;

said flanges being made of a single crystal high Tc superconductor material;

said flanges being connected to the main waveguide and the branch guide;

voltage means for applying a bias electric field to the third ferroelectric material to set the zero signal operating point;

a fourth tapered branch guide being made of a single crystal high Tc superconductor material and being connected in series to the said main waveguide, and having a length of one or more half wavelengths at the operating frequency of the limiter;

a fourth reduced height branch guide, being of lower height than the said third reduced height guide, being made of a single crystal high Tc superconductor material, at the end of the fourth tapered branch guide;

the distance between the centers of the third and the fourth branch guides, on the main waveguide, is one or two half wavelengths at the operating frequency of the limiter;

the said fourth branch guide being connected to the said main waveguide;

a fourth iris being made of a single crystal high Tc superconductor material and being placed at the end of the fourth tapered branch guide;

an appropriate length, longer than the third, of the said fourth reduced height branch guide, made from a single crystal high Tc superconductor material forming a fourth resonant cavity tuned to the operating frequency of the limiter;

a fourth ferroelectric material, being connected across the fourth reduced height and in the middle of the fourth reduced height said fourth resonant cavity at the point of the maximum electric field, forming a variable capacitance;

the fourth ferroelectric material being of a lower height than the third ferroelectric material;

a fourth waveguide short being made of a single crystal high Tc superconductor material and being connected at the end of the said fourth reduced height branch guide;

a fourth large level of the input signal, lower than the third level, at which the said fourth resonant cavity loaded with the capacitance of the said fourth ferroelectric material forms resonance to the operating frequency of the limiter;

said flanges being made of a single crystal high Tc superconductor material;

said flanges being connected to the main and the branch guides;

voltage means for applying a bias electric field to the fourth ferroelectric material to set the zero signal operating point; and means for keeping the limiter at the high Tc superconducting temperature slightly above the Curie temperature of the ferroelectric material.

14. A ferroelectric limiter of claim 13;

all said waveguides, irises, waveguide shorts and flanges being made of a single crystal dielectric material the interior conducting surfaces of which being coated with a film of single crystal high Tc superconductor material.

15. A ferroelectric limiter of claim 13;

all waveguides, branch guide, irises, waveguide shorts and flanges being made of a single crystal dielectric the interior conducting surfaces of which are coated with a film of a single crystal high Tc superconductor material; and said ferroelectric being potassium tantalum-niobate.

16. A ferroelectric limiter having an input, output, a ground plane and comprising of:

a first microstrip line, three or more half wavelengths long at the operating frequency of the limiter, on a dielectric film forming a main transmission line;

a second microstrip line on a first ferroelectric film having a permittivity that is a function of the electric field in which it is immersed and one or more half wavelengths long at the operating frequency of the limiter, forming a first branch or stub line and connected one half wavelength from one end of the main transmission line;

a third microstrip line on a second ferroelectric film having a permittivity that is a function of the electric field in which it is immersed, longer than the second microstrip line on the first ferroelectric film, and two or more half-wavelengths long at the operating frequency of the limiter, forming a second branch or stub line and connected one wavelength from said one end of the main transmission line;

a conductive coating on the bottom side of the limiter forming a ground plane; and means for applying a d.c. bias electric field to the limiter to adjust its initial operating point.

17. A ferroelectric limiter of claim 16;

said first microstrip line being six half wavelengths long at the operating frequency of the limiter;

a fourth microstrip line on a third ferroelectric film having a permittivity that is a function of the electric field in which it is immersed, longer than the third microstrip line on the second ferroelectric film, and three or more half wavelengths long at the operating frequency of the limiter, forming a third branch or stub line and connected three half wavelengths, at the operating frequency of the limiter, from said one end of the main transmission line;

a fifth microstrip line on a fourth ferroelectric film having a permittivity that is a function of the electric field in which it is immersed, longer than the fourth microstrip line on the third ferroelectric film, and four or more half wavelengths long at the operating frequency of the limiter, forming a fourth branch or stub line and connected four half wavelengths, at the operating frequency of the limiter from said one end of the main transmission line;

a sixth microstrip line on a ferroelectric film having a permittivity that is a function of the electric field in which it is immersed, longer than the fifth microstrip line on the fourth ferroelectric film, and five or more half wavelengths long at the operating frequency of the limiter, forming a fifth branch or stub line and connected five half wavelengths, at the operating frequency of the limiter, from said one end of the main transmission line;

all the conductors and the conductive coatings being made of a film of a single crystal high Tc superconductor material; and means for keeping the limiter at the high Tc superconducting temperature slightly above the Curie temperature of the ferroelectric film.

18. A ferroelectric limiter of claim 16 and comprising:

said first microstrip line, being four half wavelengths long at the operating frequency of the limiter;

said second microstrip transmission line having a low impedance;

said third microstrip transmission line having a larger impedance than the second microstrip line causing limiting at a level of the input signal lower than that at which the first branch line causes limiting;

a fourth microstrip transmission line on a third ferroelectric film having a permittivity that being a function of the electric field in which it is immersed, longer and having a larger impedance than the third microstrip line and being three or more half wavelengths long at the operating frequency of the limiter, forming a third branch or stub line and being connected two half wavelengths, at the operating frequency of the limiter, from said one end of the main transmission line and causing limiting at a level of the input signal lower than that at which the second branch line causes limiting;

a fifth microstrip transmission line on a fourth ferroelectric film having a permittivity that being a function of the electric field in which it is immersed, longer and having a larger impedance than the fourth microstrip line and being four or more half wavelengths long at the operating frequency of the limiter, forming a fourth branch or stub line and being connected two half wavelengths, at the operating frequency of the limiter, from said one end and on the other side of the main transmission line and causing limiting at a level of the input signal lower than that at which the third branch line causes limiting;

a sixth microstrip transmission line on a fifth ferroelectric film having a permittivity that being a function of the electric field in which it is immersed, longer and having a larger impedance than the fifth microstrip line and being five or more half wavelengths long at the operating frequency of the limiter, forming a fifth branch or stub line and being connected three half wavelengths, at the operating frequency of the limiter, from said one end of the main transmission line and causing limiting at a level of the input signal lower than that at which the fourth branch line causes limiting;

an edge coupled filter one at the input and one at the output to isolate the d.c. circuit of the limiter from the input and output microwave circuits and comprising:

a seventh microstrip coupled line on the same dielectric film as the said main transmission line and being quarter-wavelength long, at the operating frequency of the limiter, and being connected, with an appropriate length of uncoupled microstrip line, to the input side of the main transmission line;

an eighth microstrip line, edge coupled to the seventh microstrip line and being quarter of a wavelength long, at the operating frequency of the limiter, and being connected, with an appropriate length of uncoupled microstrip line, to the input;

a ninth microstrip coupled line on the same dielectric film as the said main transmission line and being quarter-wavelength long, at the operating frequency of the limiter, and being connected, with an appropriate length of uncoupled microstrip line, to the output side of the main transmission line;

a tenth microstrip line, edge coupled to the ninth microstrip line and being quarter of a wavelength long, at the operating frequency of the limiter, and being connected, with an appropriate length of uncoupled microstrip line, to the output;

all conductors and conductive coatings being made of a film of a single crystal high Tc superconductor material; and means for keeping the limiter at the high Tc superconducting temperature slightly above the Curie temperature of the ferroelectric film.

19. A ferroelectric limiter as recited in claim 18;

said limiter being an integral part of a monolithic microwave integrated circuit (MMIC).

20. A ferroelectric limiter of claim 16;

said second microstrip line being on a dielectric film;

said third microstrip line being on a body of a first ferroelectric film, whose permittivity is a function of the electric field in which it is immersed, forming a variable capacitance of a parallel resonant circuit tuned to the operating frequency of the limiter, and being connected to the said second microstrip line of the first branch line;

a fourth microstrip line on a dielectric film, forming an inductance of a parallel resonant circuit tuned to the operating frequency of the limiter, and being connected to the third microstrip line on the first ferroelectric film of the first branch line;

a fifth microstrip line, of appropriate length, on a ferroelectric or a dielectric film of high permittivity forming an RF short circuit and being connected to the fourth microstrip line on the dielectric film of the first branch line;

a first large level of the input signal at which the capacitance of the third microstrip line on a first ferroelectric film forms a low impedance;

a sixth microstrip line on a dielectric film, a half wavelength long at the operating frequency of the limiter, forming a second branch or stub line and being connected one half wavelength, at the operating frequency of the limiter, away from said one end and on the opposite side of the main transmission line;

a seventh microstrip line on a body of a second ferroelectric film, whose permittivity is a function of the electric field in which it is immersed, forming a variable capacitance of a parallel resonant circuit tuned to the operating frequency of the limiter, being of higher impedance than the third microstrip line, and being connected to the said sixth microstrip line of the second branch line;

an eighth microstrip line on a dielectric film, longer than the fourth microstrip line, forming an inductance of a parallel resonant circuit tuned to the operating frequency of the limiter, being connected to the seventh microstrip line on the ferroelectric film of the second branch line;

a ninth microstrip line, of appropriate length, on a ferroelectric or a dielectric film of high permittivity forming an RF short circuit and being connected to the eighth microstrip line on the dielectric film of the second branch line;

a second large, lower than the first, level of the input signal at which the capacitance of the seventh microstrip line on a second ferroelectric film forms a low impedance;

a tenth microstrip line on a dielectric film, one half wavelength long at the operating frequency of the limiter, forming a third branch or stub line and connected two half wavelengths, at the operating frequency of the limiter, away from said one end of the main transmission line;

an eleventh microstrip line on a body of a third ferroelectric film, whose permittivity is a function of the electric field in which it is immersed, forming a variable capacitance of a parallel resonant circuit tuned to the operating frequency of the limiter, being of higher impedance than the seventh microstrip line, and being connected to the said tenth microstrip line of the third branch line;

a twelfth microstrip line on a dielectric film, longer than the eighth microstrip line, forming an inductance of a parallel resonant circuit tuned to the operating frequency of the limiter, being connected to the eleventh microstrip line on the ferroelectric film of the third branch line;

a thirteenth microstrip line, of appropriate length, on a ferroelectric or a dielectric film of high permittivity, forming an RF short circuit and being connected to the twelfth microstrip line on the dielectric film of the third branch line;

a third large, lower than the second, level of the input signal at which the capacitance of the eleventh microstrip line on a third ferroelectric film forms a low impedance;

a fourteenth microstrip line on a dielectric film, one half wavelength long at the operating frequency of the limiter, forming a fourth branch or stub line and connected two half wavelengths, at the operating frequency of the limiter, away from said one end and on the opposite side of the main transmission line;

said limiter having a minimum of two branch lines;

a fifteenth microstrip line on a body of a fourth ferroelectric film, whose permittivity is a function of the electric field in which it is immersed, forming a variable capacitance of a parallel resonant circuit tuned to the operating frequency of the limiter, being of higher impedance than the eleventh microstrip line, and being connected to the said fourteenth microstrip line of the fourth branch line;

a sixteenth microstrip line on a dielectric film, longer than the twelfth microstrip line, forming an inductance of a parallel resonant circuit tuned to the operating frequency of the limiter, being connected to the fifteenth microstrip line on the ferroelectric film of the fourth branch line;

a seventeenth microstrip line, of appropriate length, on a ferroelectric or a dielectric film of high permittivity forming an RF short circuit and being connected to the sixteenth microstrip line on the dielectric film of the third branch line; and a fourth large, lower than the third, level of the input signal at which the capacitance of the fifteenth microstrip line on a fourth ferroelectric film forms a low impedance.

\* \* \* \* \*